US012593494B2

(12) United States Patent
Ju et al.

(10) Patent No.: US 12,593,494 B2
(45) **Date of Patent: *Mar. 31, 2026**

(54) MULTI-GATE DEVICE AND RELATED METHODS

(71) Applicant: Taiwan Semiconductor Manufacturing Co., Ltd., Hsinchu (TW)

(72) Inventors: Shi Ning Ju, Hsinchu City (TW); Kuo-Cheng Chiang, Hsinchu County (TW); Ching-Wei Tsai, Hsinchu City (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1223 days.

This patent is subject to a terminal disclaimer.

(21) Appl. No.: 17/303,771

(22) Filed: Jun. 7, 2021

(65) Prior Publication Data

US 2021/0296179 A1 Sep. 23, 2021

Related U.S. Application Data

(63) Continuation of application No. 16/587,013, filed on Sep. 29, 2019, now Pat. No. 11,031,292.

(51) Int. Cl.
H10D 84/03 (2025.01)
H01L 21/762 (2006.01)
(Continued)

(52) U.S. Cl.
CPC ..... H10D 84/038 (2025.01); H01L 21/76224 (2013.01); H10B 10/00 (2023.02);
(Continued)

(58) Field of Classification Search
CPC ....... H01L 21/823431; H01L 21/76224; H01L 21/823418; H01L 21/823481;
(Continued)

(56) References Cited

U.S. PATENT DOCUMENTS 8,796,666 B1 8/2014 Huang et al.
8,815,712 B2 8/2014 Wan et al.
(Continued)

FOREIGN PATENT DOCUMENTS

CN 109524468 A 3/2019
CN 110660802 A 1/2020
(Continued)

*Primary Examiner* — Sonya McCall-Shepard
(74) *Attorney, Agent, or Firm* — Haynes and Boone, LLP

(57) ABSTRACT

A method of fabricating a device includes providing a first fin in a first device type region and a second fin in a second device type region. Each of the first and second fins include a plurality of semiconductor channel layers. A two-step recess of an STI region on opposing sides of each of the first and second fins is performed to expose a first number of semiconductor channel layers of the first fin and a second number of semiconductor channel layers of the second fin. A first gate structure is formed in the first device type region and a second gate structure is formed in the second device type region. The first gate structure is formed over the first fin having the first number of exposed semiconductor channel layers, and the second gate structure is formed over the second fin having the second number of exposed semiconductor channel layers.

20 Claims, 22 Drawing Sheets

200

PROVIDE A SUBSTRATE INCLUDING FINS 202

FORM STI FEATURES 204

PERFORM A FIRST STI RECESS 206

PERFORM A SECOND STI RECESS 208

FORM FIN CLADDING LAYER 210

FORM BI-LAYER DIELECTRIC 212

FORM DUMMY GATE 214

PERFORM FIRST SOURCE/DRAIN ETCH PROCESS 216

PERFORM SECOND SOURCE/DRAIN ETCH PROCESS 218

FORM INNER SPACERS 220

FORM SOURCE/DRAIN FEATURES 222

FORM ILD 224

DUMMY GATE REMOVAL 226

DIELECTRIC LAYER AND SiGe REMOVAL 228

FORM GATE STRUCTURE 230

PERFORM CUT METAL GATE PROCESS 232

(51) Int. Cl.

| | |
|---|---|
| *H10B 10/00* | (2023.01) |
| *H10D 30/62* | (2025.01) |
| *H10D 30/67* | (2025.01) |
| *H10D 84/01* | (2025.01) |
| *H10D 84/83* | (2025.01) |
| *H10D 84/85* | (2025.01) |

(52) U.S. Cl.
CPC ....... *H10D 30/6735* (2025.01); *H10D 84/013* (2025.01); *H10D 84/0151* (2025.01); *H10D 84/0158* (2025.01); *H10D 84/834* (2025.01)

(58) Field of Classification Search
CPC ..... H01L 21/823412; H01L 21/823807; H01L 21/823821; H01L 27/0886; H01L 27/088; H01L 27/0922; H01L 27/0924; H01L 29/42392; H01L 29/78696; H01L 29/66795; H01L 29/785; H10B 10/00; H10D 84/0151; H10D 30/6735; H10D 84/038; H10D 30/6757; H10D 84/8311; H10D 84/0128; H10D 84/0167; H10D 84/83; H10D 84/0193; H10D 84/013; H10D 84/8312; H10D 84/0158; H10D 84/834; H10D 84/853; H10D 30/024; H10D 30/62; H10D 84/856

See application file for complete search history.

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,660,028 B1 | 5/2017 | Cheng et al. |
| 9,711,412 B2 | 7/2017 | Lee et al. |
| 9,818,648 B2 | 11/2017 | Chao et al. |
| 9,853,101 B2 | 12/2017 | Peng et al. |
| 10,170,484 B1 | 1/2019 | Sung et al. |
| 10,424,580 B2 | 9/2019 | Cappellani et al. |
| 2006/0240622 A1 | 10/2006 | Lee |
| 2011/0121406 A1 | 5/2011 | Lee et al. |
| 2013/0285116 A1 | 10/2013 | Lochtefeld et al. |
| 2013/0313513 A1 | 11/2013 | Cappellani et al. |
| 2017/0040321 A1 | 2/2017 | Mitard |
| 2017/0140933 A1 | 5/2017 | Lee et al. |
| 2017/0170294 A1* | 6/2017 | Doris ................. H01L 29/6653 |
| 2017/0170331 A1 | 6/2017 | Liang et al. |
| 2018/0069006 A1 | 3/2018 | Kim |
| 2018/0151452 A1 | 5/2018 | Doornbos |
| 2018/0197784 A1 | 7/2018 | Cheng et al. |
| 2018/0374926 A1 | 12/2018 | Lee |
| 2019/0088798 A1 | 3/2019 | Kim |
| 2019/0157090 A1 | 5/2019 | Jang |
| 2020/0006333 A1 | 1/2020 | Noh |
| 2020/0043926 A1 | 2/2020 | Ohtou |
| 2020/0091349 A1 | 3/2020 | Kang |

FOREIGN PATENT DOCUMENTS

| | | |
|---|---|---|
| DE | 102018103075 A1 | 2/2019 |
| KR | 20110056225 A | 5/2011 |
| KR | 20160043152 A | 4/2016 |
| KR | 20160115655 A | 10/2016 |
| KR | 101795208 B1 | 11/2017 |
| TW | 201342580 A | 10/2013 |

* cited by examiner

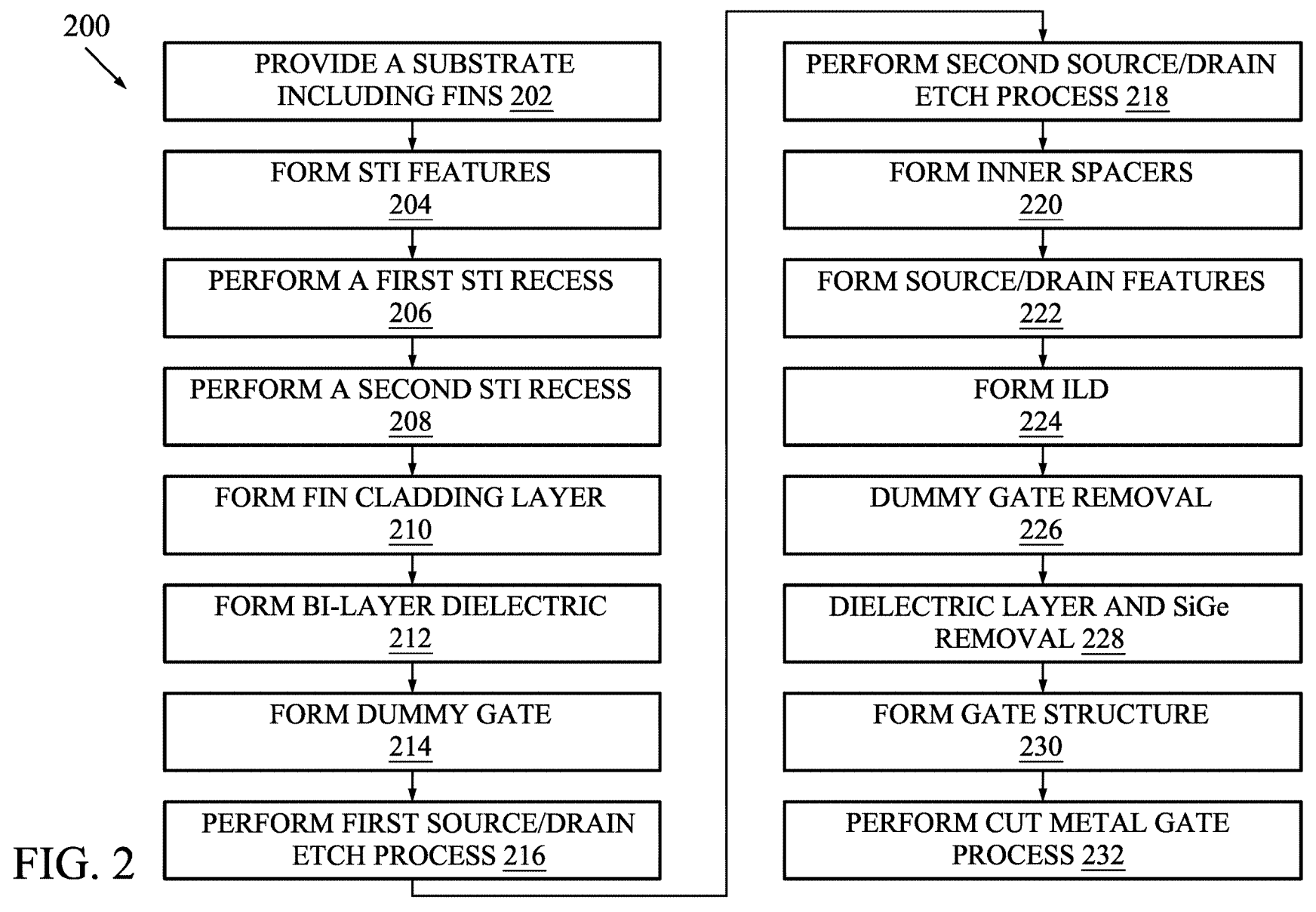

200

PROVIDE A SUBSTRATE INCLUDING FINS 202

FORM STI FEATURES 204

PERFORM A FIRST STI RECESS 206

PERFORM A SECOND STI RECESS 208

FORM FIN CLADDING LAYER 210

FORM BI-LAYER DIELECTRIC 212

FORM DUMMY GATE 214

PERFORM FIRST SOURCE/DRAIN ETCH PROCESS 216

PERFORM SECOND SOURCE/DRAIN ETCH PROCESS 218

FORM INNER SPACERS 220

FORM SOURCE/DRAIN FEATURES 222

FORM ILD 224

DUMMY GATE REMOVAL 226

DIELECTRIC LAYER AND SiGe REMOVAL 228

FORM GATE STRUCTURE 230

PERFORM CUT METAL GATE PROCESS 232

FIG. 2

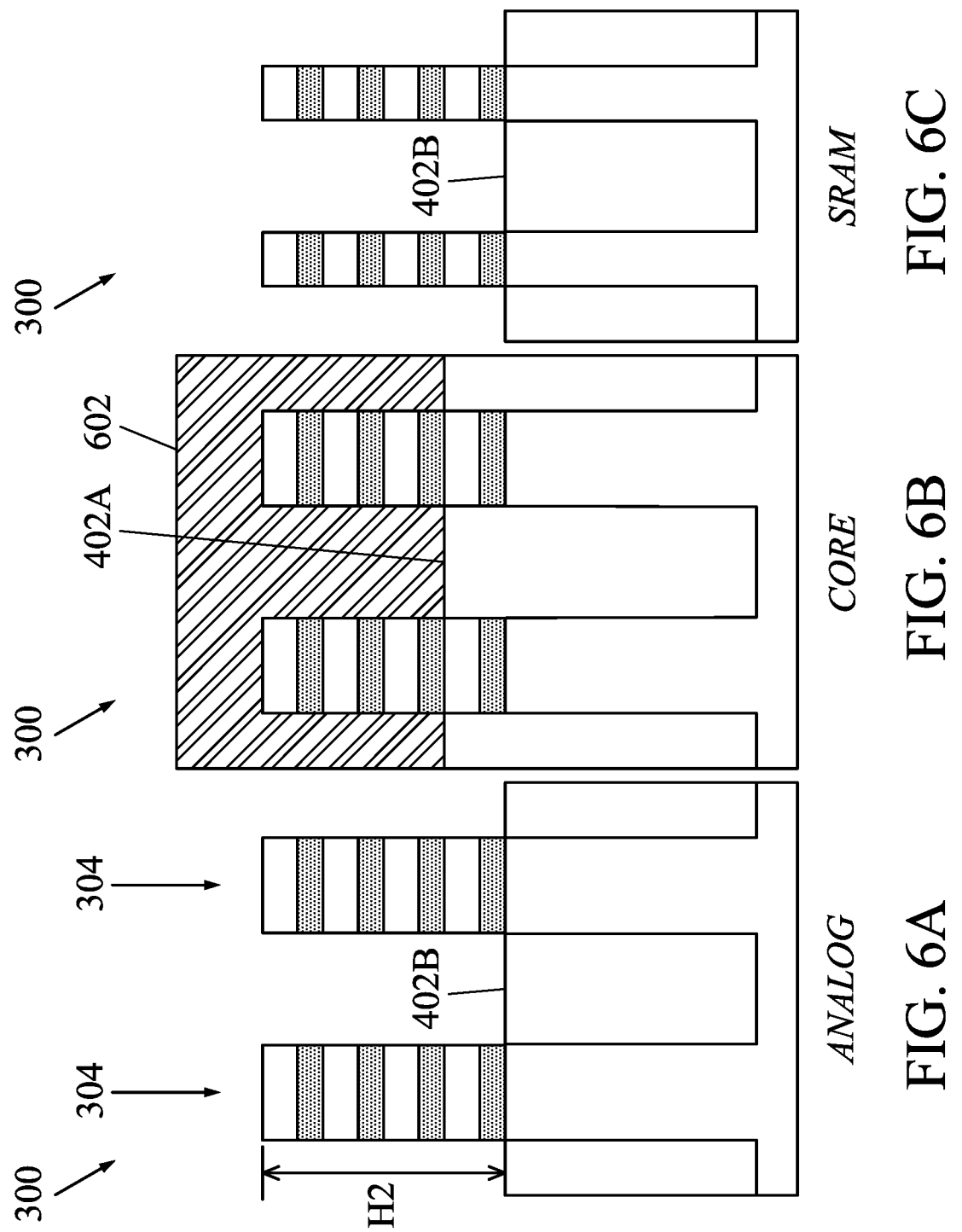

*ANALOG*

*CORE*

*SRAM*

ANALOG

CORE

SRAM

ANALOG

CORE

SRAM

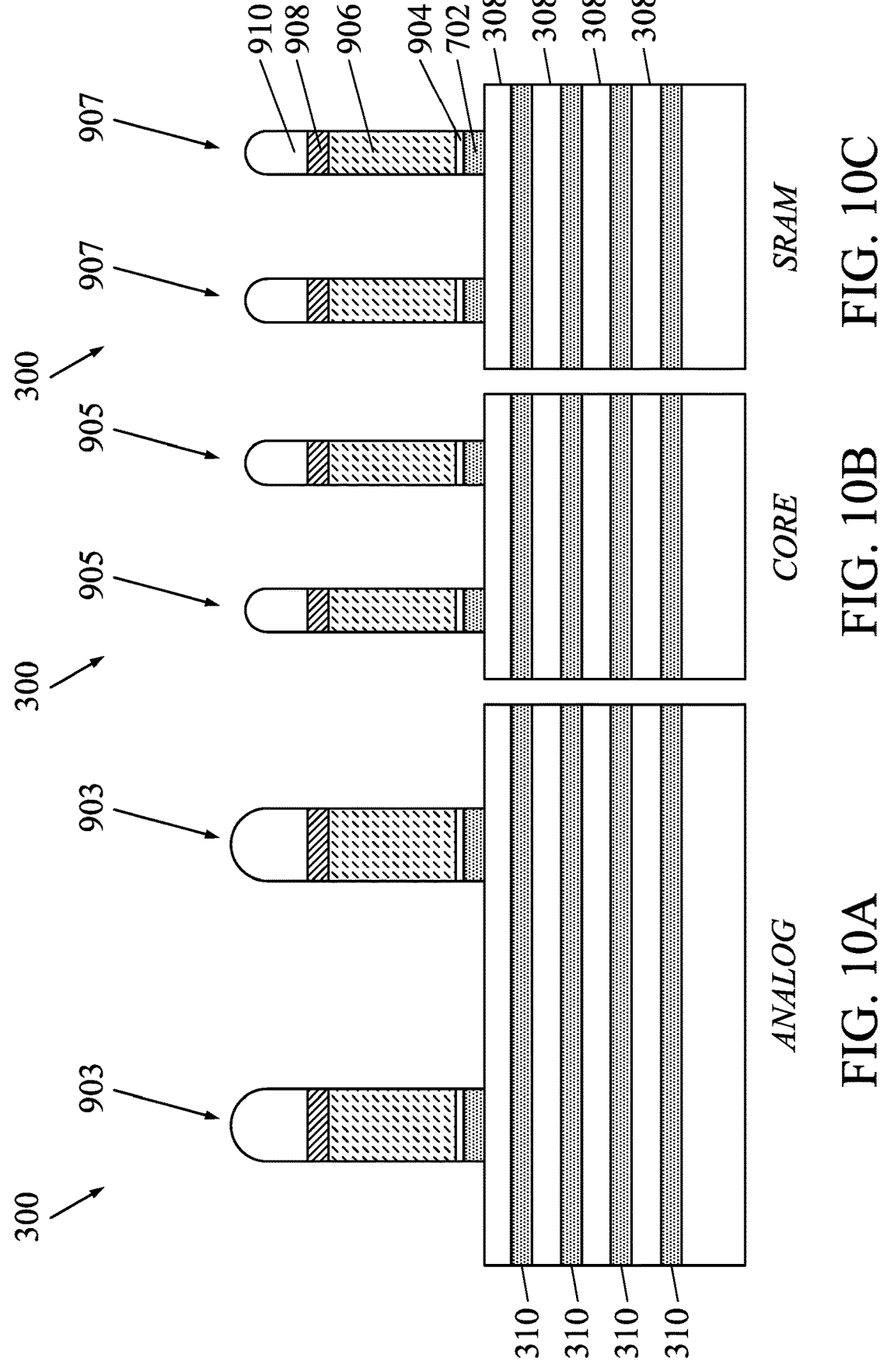
FIG. 10A     *ANALOG*
FIG. 10B     *CORE*
FIG. 10C     *SRAM*

*SRAM*

*CORE*

*ANALOG*

*ANALOG*

*CORE*

*SRAM*

SRAM

CORE

ANALOG

*SRAM*

*CORE*

*ANALOG*

*ANALOG*

*CORE*

*SRAM*

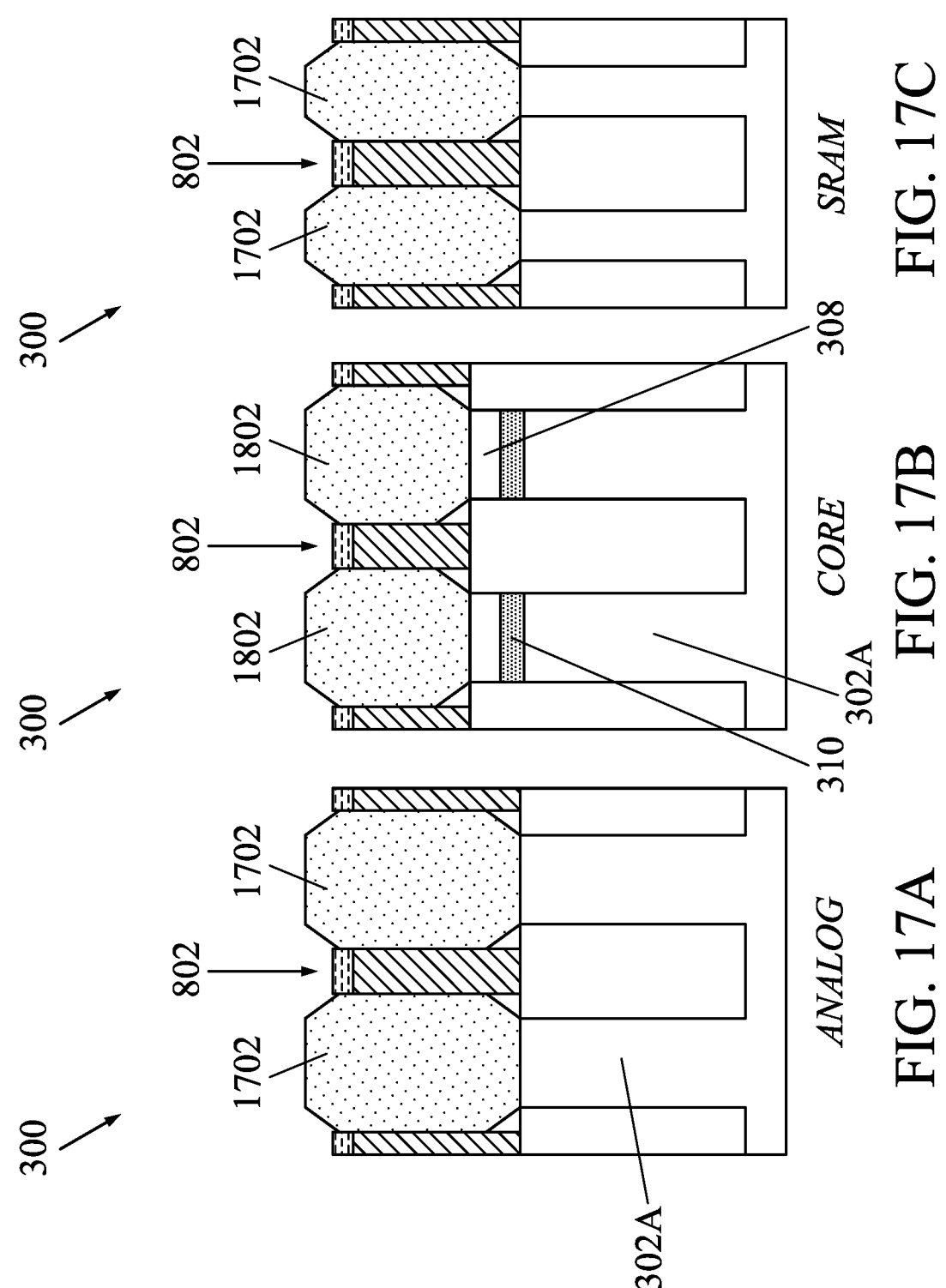

*ANALOG*

*CORE*

*SRAM*

*SRAM*

*CORE*

*ANALOG*

MULTI-GATE DEVICE AND RELATED METHODS

PRIORITY DATA

This application is a continuation of U.S. patent application Ser. No. 16/587,013, filed Sep. 29, 2019, the disclosure of which is hereby incorporated by reference in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, a semiconductor IC may generally include a variety of different device types with different performance requirements. As such, providing a multi-gate device (e.g., such as a GAA transistor) that is able to meet such diverse device performance requirements remains a challenge. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow chart of a method of fabricating a semiconductor device 300, according to one or more aspects of the present disclosure;

FIGS. 3, 4, 5, 6A/6B/6C, 7A/7B/7C, and 8A/8B/8C provide cross-sectional views of an embodiment of the semiconductor device 300 along a plane substantially parallel to a plane defined by section BB' or section CC' of FIG. 1, in accordance with some embodiments;

FIGS. 10A/10B/10C. 12A/12B/12C. 14A/14B/14C, 16A/16B/16C. 18A/18B/18C, 20A/20B/20C, and 24A/24B/24C provide cross-sectional views of an embodiment of the semiconductor device 300 along a plane substantially parallel to a plane defined by section AA' of FIG. 1, according to some embodiments.

DETAILED DESCRIPTION

Figure 1:
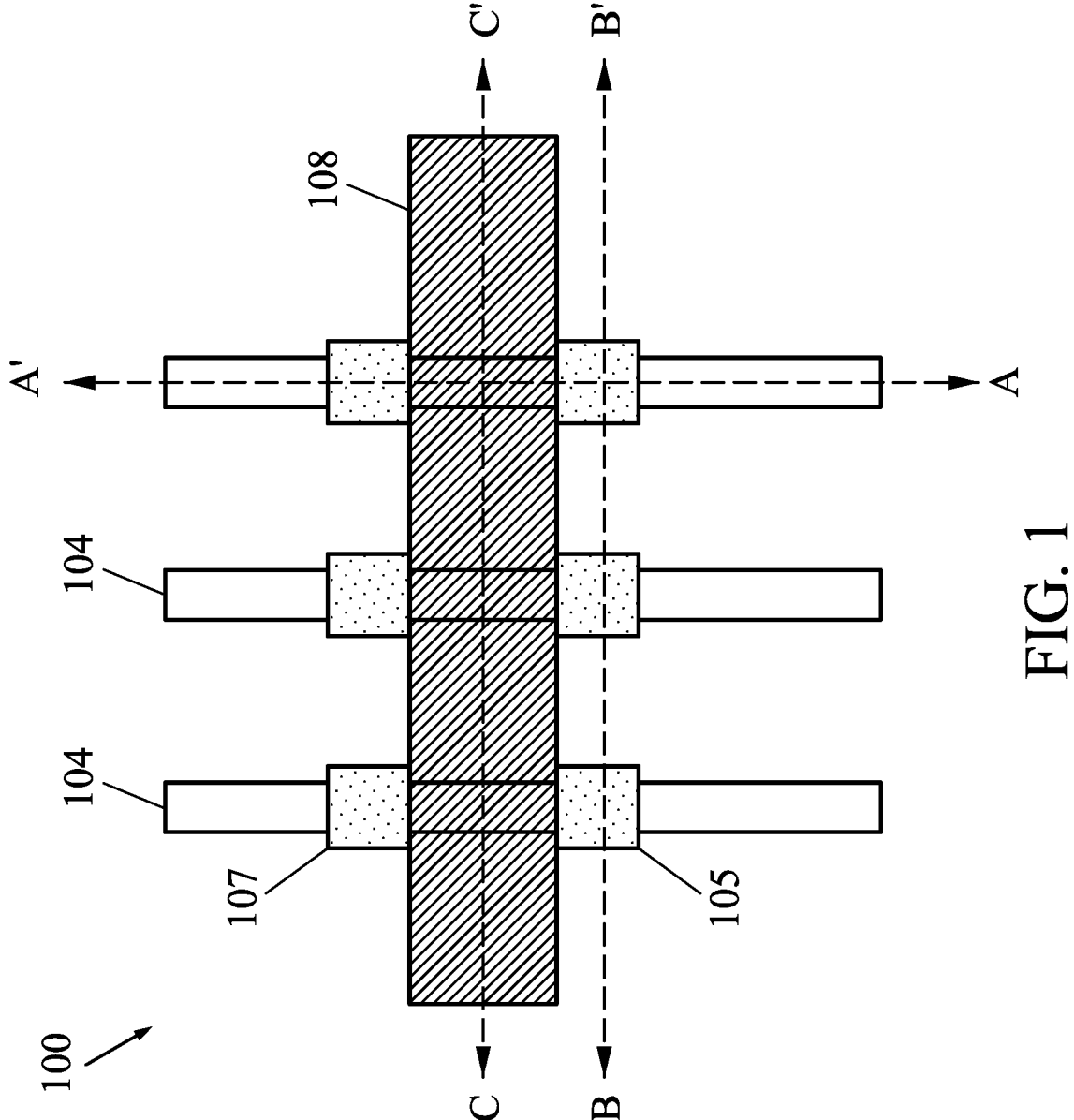
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing multi-gate devices (e.g., such as a GAA transistors) having a number of semiconductor channel layers selected based on the device type being implemented by the multi-gate device. GAA transistors may be used in a variety of device types, for example, to implement core (logic) devices, static random-access memory (SRAM) devices, and analog devices, among others. With respect to such various device types implemented using GAA transistors, and in some embodiments, core (logic) devices may be implemented using a fewer number of semiconductor channel layers as compared to SRAM and analog devices, while both SRAM and analog devices may be implemented using a greater number of semiconductor channel layers as compared to core (logic) devices. In some examples, core (logic) devices may be implemented using a fewer number of semiconductor channel layers in order to reduce total device capacitance and provide increased device speed. Alternatively, in various embodiments, SRAM devices may be implemented using a greater number of semiconductor channel layers in order to provide increased cell current. In some embodiments, analog devices may be implemented using a greater number of semiconductor channel layers in order to provide increased cell capacitance. In some examples, the number of semiconductor channel layers for a core (logic) device may be less than or equal to three (3), and the number of semiconductor channel layers for both SRAM and analog devices may be greater than or equal to four (4). Generally, by providing multi-gate devices having a number of semiconductor channel layers selected based on the device type being implemented (e.g., core, SRAM, or analog device), embodiments of the present disclosure provide methods and device structures that are able to meet the diverse performance requirements of a variety of different device types simultaneously. Moreover, as described in more detail below, the various embodiments disclosed herein and including multi-gate devices with different numbers of semiconductor channel layers may be fabricated using a single, contiguous process flow. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Referring to FIG. 2, illustrated therein is a method 200 of semiconductor fabrication including fabrication of a semiconductor device 300 (e.g., which includes a multi-gate device) having different numbers of semiconductor channel layers on a single substrate, where the number of semiconductor channel layers for a given multi-gate device is selected based on a device type being implemented, in accordance with various embodiments. The method 200 is discussed below with reference to fabrication of GAA transistors used to implement a variety of device types including core (logic) devices, static random-access memory (SRAM) devices, and analog devices. However, it will be understood that aspects of the method 200 may be equally applied to other types of multi-gate devices, or to other types of devices implemented by the multi-gate devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is noted that certain aspects of the method 200 are described as being performed in a region of the semiconductor device 300 including a particular device type (e.g., such as a core (logic) device, an SRAM device, and/or an analog device). However, if not described as being performed in a region including a particular device type, the step of the method 200 being described may be assumed as being performed across a plurality of regions including a plurality of devices types (e.g., across a plurality of device type regions). Further, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 includes a plurality of semiconductor devices (e.g., transistors), including PFETs, NFETs, etc., which may be interconnected. Moreover, it is noted that the process steps of method 200, including any descriptions given with reference to the figures are merely exemplary and are not intended to be limiting beyond what is specifically recited in the claims that follow.

Figures 3, 4, 5:
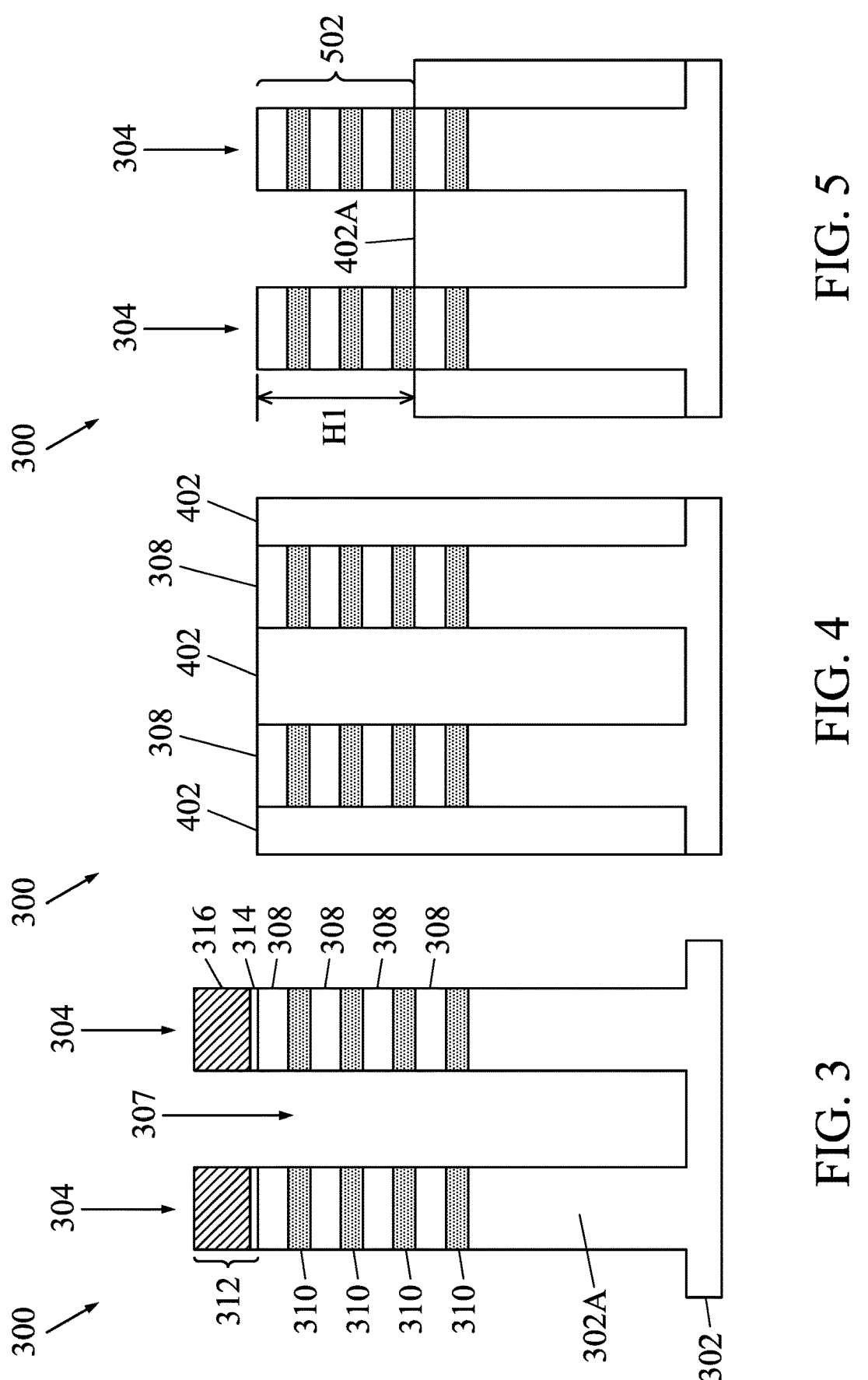

The method 200 begins at block 202 where a substrate including fins is provided. Referring to the example of FIG. 3, in an embodiment of block 202, a substrate 302 including fins 304 is provided. FIG. 3 provides a cross-sectional view of an embodiment of the semiconductor device 300 along a plane substantially parallel to a plane defined by section BB' or section CC' of FIG. 1. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

The fins 304, which include layers 308 and 310, may be formed by growing epitaxial layers of a first composition (e.g., which are subsequently patterned to form the layers 310) interposed by epitaxial layers of a second composition (e.g., which are subsequently patterned to form the layers 308). In an embodiment, the epitaxial layers of the first composition (e.g., used to form layers 310) are SiGe and the epitaxial layers of the second composition (e.g., used to form layers 308) are silicon (Si). However, other embodiments are possible including those that provide for a first composition and a second composition having different oxidation rates and/or etch selectivity. For example, in some embodiments, either of the epitaxial layers of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the epitaxial layers of the first composition or the second composition may be performed by a molecular beam epitaxy (MBE) process, a metalorganic chemical vapor deposition (MOCVD) process, and/or other suitable epitaxial growth processes. It is also noted that while the layers 308, 310 are shown as having a particular stacking sequence within the fins 304, where the layer 308 is the topmost layer of the stack of layers 308, 310, other configurations are possible. For example, in some cases, the layer 310 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure.

After forming the epitaxial layers of the first composition (e.g., used to form the layers 310) and the epitaxial layers of the second composition (e.g., used to form the layers 308), a hard mask (HM) layer may be formed over the device 300. In some embodiments, the HM layer may be subsequently patterned, as described below, to form an HM layer 312, where the HM layer 312 includes an oxide layer 314 (e.g., a pad oxide layer that may include $SiO_2$) and nitride layer 316 (e.g., a pad nitride layer that may include $Si_3N_4$) formed over the oxide layer 314. In some examples, the oxide layer 314 may include thermally grown oxide, CVD-deposited oxide, and/or ALD-deposited oxide, and the nitride layer 316 may include a nitride layer deposited by CVD or other suitable technique. Generally, in some embodiments, the HM layer may include a nitride-containing material deposited by CVD, ALD, PVD, or other suitable process.

After forming the HM layer, the fins 304 extending from the substrate 302 are formed. The fins 304 may be fabricated using suitable processes including photolithography and etch processes. The photolithography process may include forming a photoresist layer over the device 300, exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 302, and layers formed thereupon, while an etch process forms trenches 307 in unprotected regions through the HM layer, through the epitaxial layers of the first composition and the second composition, and into the substrate 302, thereby leaving the plurality of extending fins 304. The trenches 307 may be etched using a dry etch (e.g., reactive ion etching), a wet etch, and/or other suitable processes.

In various embodiments, each of the fins 304 includes a substrate portion 302A formed from the substrate 302, the layers 310 (e.g., including the first composition), the layers 308 (e.g., including the second composition), and the HM layer 312. In some embodiments, the HM layer 312 may be removed (e.g., by a CMP process) prior to formation of the fins 304. In some examples, the HM layer 312 is used to mitigate loss of material of the fins 304 during a subsequent gate etch process. In various embodiments, the epitaxial layers 308 (e.g., including the second composition), or portions thereof, may form a channel region of a GAA transistor of the device 300. For example, the layers 308 may be referred to as semiconductor channel layers that are used to form a channel region of a GAA transistor. In various embodiments, the semiconductor channel layers (e.g., the layers 308 or portions thereof) may include nanosheet channel(s), nanowire channel(s), bar-shaped channel(s), and/or other suitable channel configurations. The semiconductor channel layers are also used to form portions of the source/drain features of the GAA transistor, as discussed below.

It is noted that while the fins 304 are illustrated as including four (4) layers of the epitaxial layer 310 and four (4) layers of the epitaxial layer 308, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some examples, the number of epitaxial layers, and thus the number of semiconductor channel layers, is selected based on the device type being implemented by the GAA transistor (e.g., such as core (logic) devices, SRAM devices, or analog devices, among others). In some embodiments, the number of epitaxial layers 308, and thus the number of semiconductor channel layers, is between 4 and 10.

In some embodiments, the epitaxial layers 310 each have a thickness range of about 4-8 nanometers (nm). In some cases, the epitaxial layers 308 each have a thickness range of about 4-8 nm. As noted above, the epitaxial layers 308 may serve as channel region(s) for a subsequently-formed multi-gate device (e.g., a GAA transistor) and its thickness may be chosen based at least in part on device performance considerations. The epitaxial layers 310 may serve to define a gap distance between adjacent channel region(s) for the subsequently-formed multi-gate device and its thickness may also be chosen based at least in part on device performance considerations.

The method 200 then proceeds to block 204 where shallow trench isolation (STI) features are formed. With reference to FIGS. 3 and 4, in an embodiment of block 204, STI features 402 are formed interposing the fins 304. FIG.

4 provides a cross-sectional view of an embodiment of the semiconductor device 300 along a plane substantially parallel to a plane defined by section BB' or section CC' of FIG. 1. In some examples, after forming the fins 304, the trenches 307 interposing the fins 304 may be filled with a dielectric material. In some embodiments, the dielectric material used to fill the trenches 307 may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, and/or other suitable process.

In some examples, after depositing the dielectric material, a CMP process may be performed to remove excess portions of the dielectric material and to planarize a top surface of the device 300, thus forming the STI features 402, as shown in FIG. 4. In some embodiments, the CMP process may also remove the HM layer 312 over each of the fins 304 to expose a topmost layer of the stack of layers 308, 310. In the present example, the topmost layer of the stack of layers 308, 310 includes an epitaxial layer 308. However, other stack configurations are possible, as previously discussed.

The method 200 then proceeds to block 206 where a first STI recess process is performed. With reference to FIGS. 4 and 5, in an embodiment of block 206, an STI recess process is performed to recess the STI features 402, thus forming recessed STI features 402A, as shown in FIG. 5. FIG. 5 provides a cross-sectional view of an embodiment of the semiconductor device 300 along a plane substantially parallel to a plane defined by section BB' or section CC' of FIG. 1. In various embodiments, the recessed STI features 402A formed by the first STI recess process may be formed across a plurality of regions of the semiconductor device 300 including a plurality of device types (e.g., core devices, SRAM devices, and analog devices). In various examples, the STI features 402A are recessed such that the fins 304 extend above the STI features 402A. In some embodiments, the recessing process may include a dry etching process, a wet etching process, and/or a combination thereof. In some embodiments, a recessing depth of the first STI recess process is controlled (e.g., by controlling an etching time) to result in a desired height 'H1' of the exposed upper portion of the fins 304. In some embodiments, the height 'H1' exposes a subset 502 of the epitaxial stack of layers 308, 310 of each of the fins 304. In various examples, the exposed subset 502 of the epitaxial stack of layers 308, 310 includes a first number of exposed epitaxial layers 308. Stated another way, the exposed subset 502 of the epitaxial stack of layer 308, 310 includes a first number of exposed semiconductor channel layers. Epitaxial layers 308, 310 (including at least one semiconductor channel layer) not exposed by the first STI recess process may remain embedded within the STI features 402A. As described in more detail below, the first number of exposed semiconductor channel layers, provided by the subset 502, may define a first number of semiconductor channel layers for a first device type disposed within a first region of the semiconductor device 300. In the present example, the first device type corresponding to the first number of exposed semiconductor channel layers may include a core (logic) device. Moreover, while the subset 502 is illustrated as including three (3) semiconductor channel layers, in some cases the subset 502 may alternatively include less than three (3) semiconductor channel layers.

The method 200 then proceeds to block 208 where a second STI recess process is performed. With reference to FIGS. 5 and 6A/6B/6C, in an embodiment of block 208, an STI recess process is performed to further recess the STI features 402A, thus forming recessed STI features 402B, as shown in FIGS. 6A and 6C. FIGS. 6A/6B/6C provide cross-sectional views of an embodiment of the semiconductor device 300 along a plane substantially parallel to a plane defined by section BB' or section CC' of FIG. 1. In some embodiments, the recessed STI features 402B formed by the second STI recess process may be formed in an analog device region (FIG. 6A) and an SRAM device region (FIG. 6C) of the semiconductor device 300, while the STI features 402A remain within a core device region (FIG. 6B) of the semiconductor device 300. For example, prior to forming the recessed STI features 402B, a resist layer is formed over the device 300 and patterned to form a patterned resist layer 602 that exposes the analog and SRAM device regions of the semiconductor device 300, while the patterned resist layer 602 remains disposed over the core device region. In some embodiments, after formation of the patterned resist layer 602, the second STI recess process is performed to further recess the STI features 402A to form the STI features 402B within the analog and SRAM device regions, while the core device region remains masked by the patterned resist layer 602. In some embodiments, the recessing process may include a dry etching process, a wet etching process, and/or a combination thereof. After the second STI recess process, the patterned resist layer 602 may be removed, for example, by way of a solvent, resist stripper, ashing, or other suitable technique.

In some embodiments, a recessing depth of the second STI recess process is controlled (e.g., by controlling an etching time) to result in a desired height 'H2' of the exposed upper portion of the fins 304 in the analog and SRAM device regions. In some embodiments, the height 'H2' exposes one or more of layers of the epitaxial stack of layer 308, 310 that were previously covered by the STI features 402A. In various examples, the second STI recess process serves to expose one or more additional epitaxial layers 308 resulting in a total number of exposed epitaxial layers 308 that is greater than the first number of epitaxial layers 308 exposed by the first STI recess process. Stated another way, the second STI recess process serves to expose one or more additional semiconductor channel layers resulting in a total number of exposed semiconductor channel layers that is greater than the first number of semiconductor channel layers exposed by the first STI recess process. Thus, in various embodiments, the number of exposed semiconductor channel layers in the analog and SRAM device regions (FIGS. 6A and 6C) is greater than the number of exposed semiconductor channel layers in the core device region (FIG. 6B). In at least some embodiments, the second STI recess process serves to expose all of the epitaxial layers 308 in the analog and SRAM device regions. As described in more detail below, the number of exposed epitaxial layers 308 in the analog and SRAM device regions may define a number of semiconductor channel layers for analog and SRAM devices formed in respective regions of the semiconductor device 300. While the example of FIGS. 6A and 6C are illustrated as including four (4) semiconductor channel layers within the analog and SRAM device regions, respectively, in some cases the analog and SRAM device regions may alternatively include more than four (4) semiconductor channel layers.

Figures 7A, 7B, 7C:
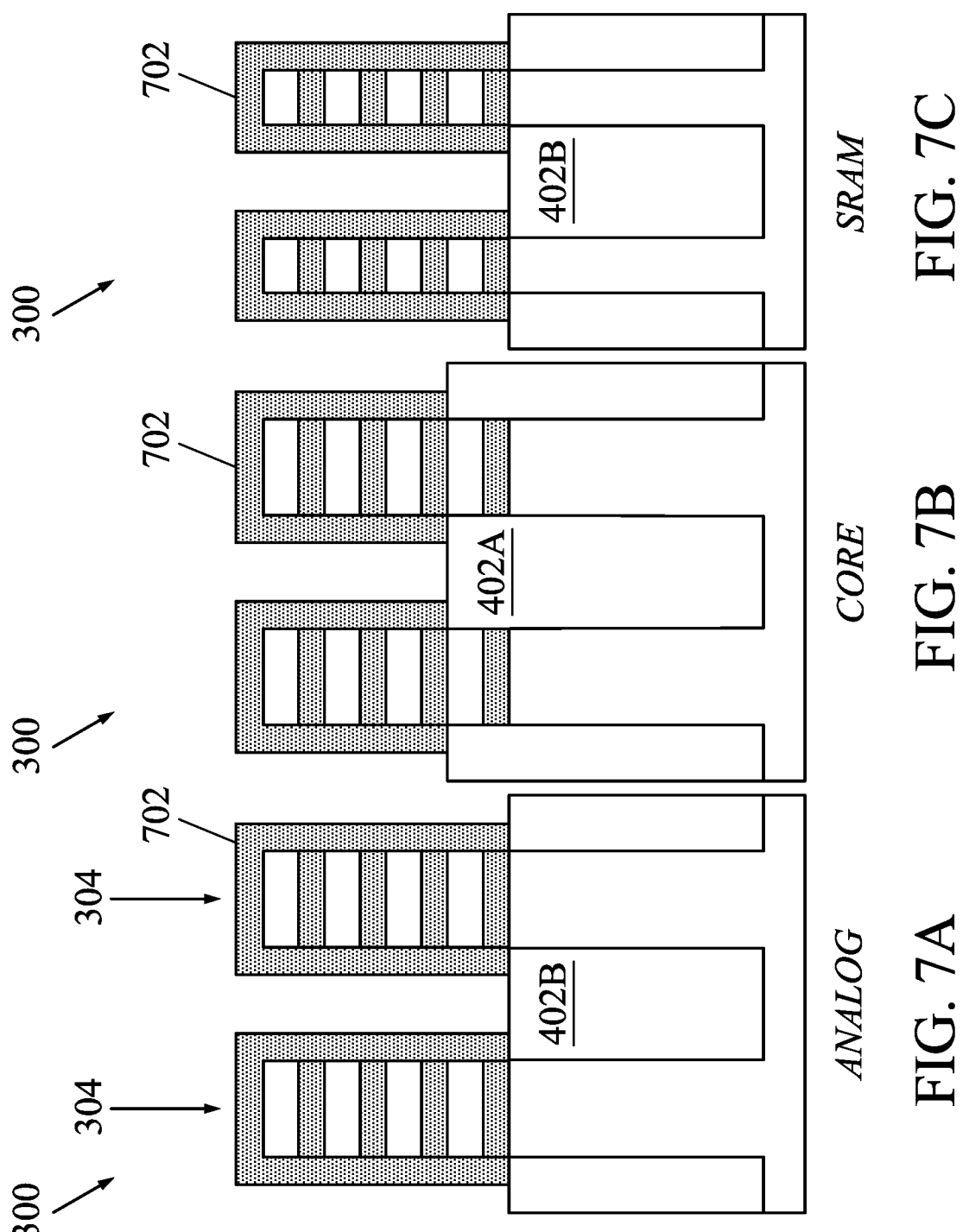

The method 200 then proceeds to block 210 where a fin cladding layer is formed. With reference to FIGS. 6A/6B/6C and 7A/7B/7C, in an embodiment of block 210, a fin cladding layer 702 may be formed over the fins 304 in each of the analog, core, and SRAM device regions of the semiconductor device 300. FIGS. 7A/7B/7C provide cross-sectional views of an embodiment of the semiconductor device 300 along a plane substantially parallel to a plane defined by section BB' or section CC' of FIG. 1. In some embodiments, the fin cladding layer 702 includes an epitaxial SiGe layer. The fin cladding layer 702 may be deposited conformally over each of the fins 304. By way of example, the fin cladding layer 702 may be deposited by an MBE process, an MOCVD process, an ALD process, and/or other suitable epitaxial growth processes. In various embodiments, the fin cladding layer 702 is a sacrificial layer that is removed at a subsequent processing stage, as described below. Further, the fin cladding layer 702 may be used to increase the gate area density of the GAA transistors formed on the semiconductor device 300. For instance, in a gate region of a device (e.g., within the analog, core, or SRAM device regions), an area occupied by the fin cladding layer 702 may subsequently be replaced by a gate structure (e.g., including a dielectric layer and a metal gate layer). In some cases, the fin cladding layer 702 has a thickness in a range of about 4-16 nm. In various embodiments, the thickness of the fin cladding layer 702 may be selected to provide a desired area density for the subsequently formed gate structure (e.g., to provide a lower gate resistance), while also providing an adequate process window for fabrication of the semiconductor device 300.

Figures 8A, 8B, 8C:
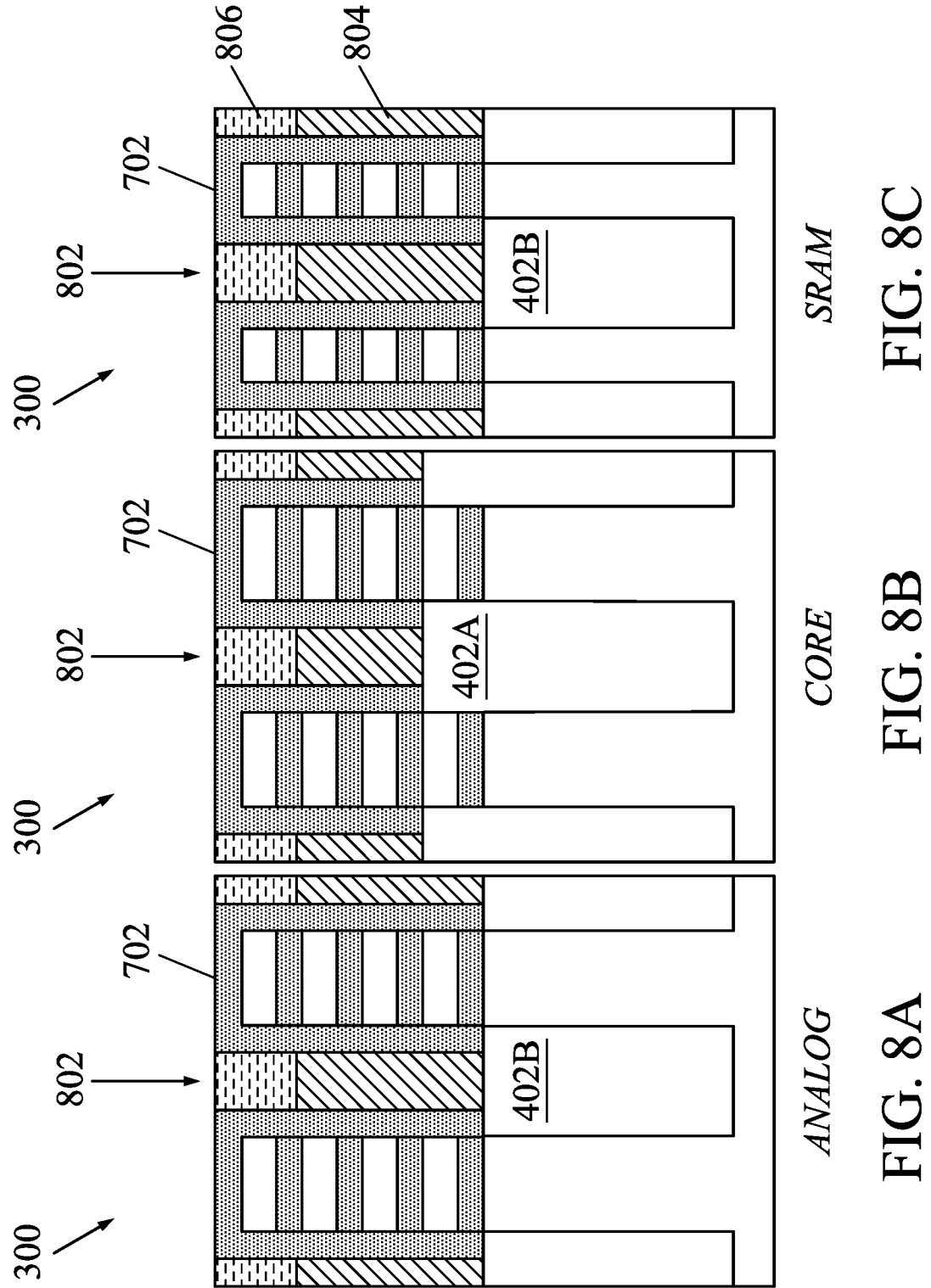

The method 200 then proceeds to block 212 where a bi-layer dielectric is formed. With reference to FIGS. 7A/7B/7C and 8A/8B/8C, in an embodiment of block 212, a bi-layer dielectric 802 may be formed within each of the analog, core, and SRAM device regions of the semiconductor device 300. FIGS. 8A/8B/8C provide cross-sectional views of an embodiment of the semiconductor device 300 along a plane substantially parallel to a plane defined by section BB' or section CC' of FIG. 1. In some embodiments, the bi-layer dielectric 802 is formed by filling trenches adjacent to the fin cladding layer 702 (deposited over each of the fins 304) with a first material 804 and a second material 806 disposed over the first material 804, thereby forming the bi-layer dielectric 802. In various cases, the bi-layer dielectric 802 may be deposited by a CVD process, an ALD process, a PVD process, and/or other suitable process. In some examples, after depositing the first material 804 and the second material 806, a CMP process may be performed to remove excess material portions and to planarize a top surface of the device 300, to provide the bi-layer dielectric 802. In some embodiments, the first material 804 may include a low-K (LK) material including SiCN, SiOC, SiOCN, or another low-K material (e.g., with a dielectric constant 'k'<7). In some examples the second material 806 may include a high-K (HK) material including $HfO_2$, $ZrO_2$, $HfAlO_x$, $HfSiO_x$, $Al_2O_3$, or another high-K material (e.g., with a dielectric constant 'k'>7). Thus, in various cases, the bi-layer dielectric 802 includes a HK upper portion (e.g., the second material 806) and a LK lower portion (e.g., the first material 804). In some examples, a ratio of the upper portion to the lower portion, that is a HK/LK ratio, is about 1/20-20/1. In some embodiments, the bi-layer dielectric 802 serves to enlarge a cut metal gate (CMG) process window. Further, in some cases, the bi-layer dielectric 802 may be used to prevent the undesirable lateral merging of source/drain epi-layers subsequently formed on adjacent fins 304.

The method 200 then proceeds to block 214 where a dummy gate structure is formed. While the present discussion is directed to a replacement gate (gate-last) process whereby a dummy gate structure is formed and subsequently replaced, other configurations may be possible.

Figures 9A, 9B, 9C:
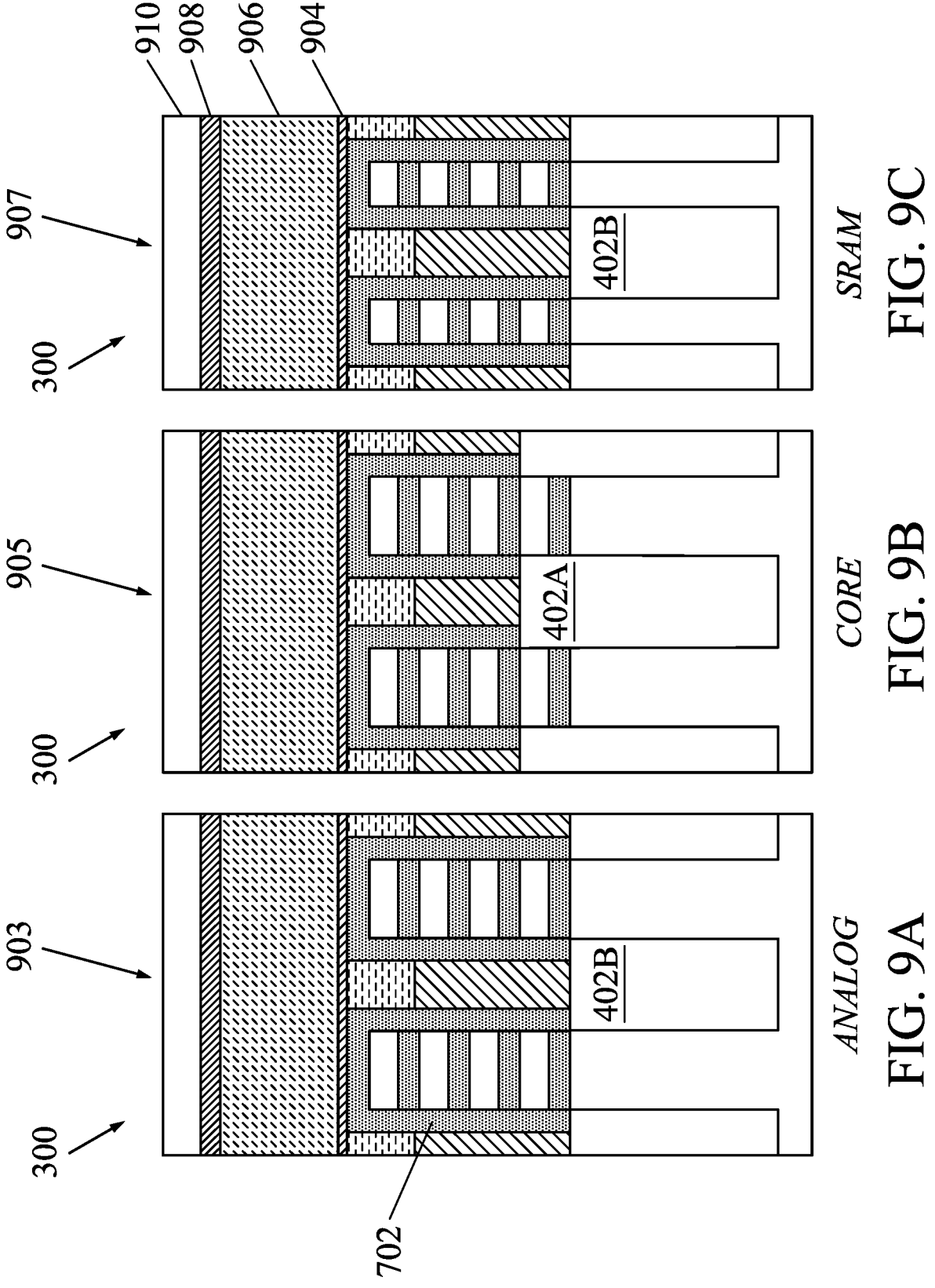
FIGS. 9A/9B/9C, 21A/21B/21C. 22A/22B/22C, and 23A/23B/23C provide cross-sectional views of an embodiment of the semiconductor device 300 along a plane substantially parallel to a plane defined by section CC' of FIG. 1, according to some embodiments.

With reference to FIGS. 9A/9B/9C and 10A/10B/10C, in an embodiment of block 214, gate stacks 903, 905, 907 are formed over the fins 304 within each of the analog, core, and SRAM device regions of the semiconductor device 300. The FIGS. 9A/9B/9C provide cross-sectional views of an embodiment of the semiconductor device 300 along a plane substantially parallel to a plane defined by section CC' of FIG. 1, and the FIGS. 10A/10B/10C provide cross-sectional views of an embodiment of the semiconductor device 300 along a plane substantially parallel to a plane defined by section AA' of FIG. 1. In an embodiment, the gate stacks 903, 905, 907 are dummy (sacrificial) gate stacks that are subsequently removed and replaced by the final gate stack at a subsequent processing stage of the device 300, as discussed below. The gate stacks 903, 905, 907 may be replaced at a later processing stage by a high-K dielectric layer (HK) and metal gate electrode (MG). In some embodiments, the gate stacks 903, 905, 907 are formed over the substrate 302 and are at least partially disposed over the fins 304 within each of the analog, core, and SRAM device regions of the semiconductor device 300. The portion of the fins 304 underlying the gate stacks 903, 905, 907 may be referred to as the channel region. The gate stacks 903, 905, 907 may also define a source/drain region of the fins 304, for example, the regions of the fins 304 adjacent to and on opposing sides of the channel region.

In some embodiments, the gate stacks 903, 905, 907 include a dielectric layer 904 and an electrode layer 906. The gate stacks 903, 905, 907 may also include one or more hard mask layers 908, 910. In some embodiments, the hard mask layer 908 may include an oxide layer, and the hard mask layer 910 may include a nitride layer. In some embodiments, the gate stacks 903, 905, 907 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In forming the gate stacks 903, 905, 907 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer 904 includes silicon oxide. Alternatively, or additionally, the dielectric layer 904 may include silicon nitride, a high-K dielectric material or other suitable material. In some embodiments, the electrode layer 906 may include polycrystalline silicon (polysilicon). In some embodiments, the oxide of the hard mask layer 908 includes a pad oxide layer that may include $SiO_2$. In some embodiments, the nitride of the hard mask layer 910 includes a pad nitride layer that may include $Si_3N_4$, silicon oxynitride or silicon carbide.

Figures 12A, 12B, 12C:
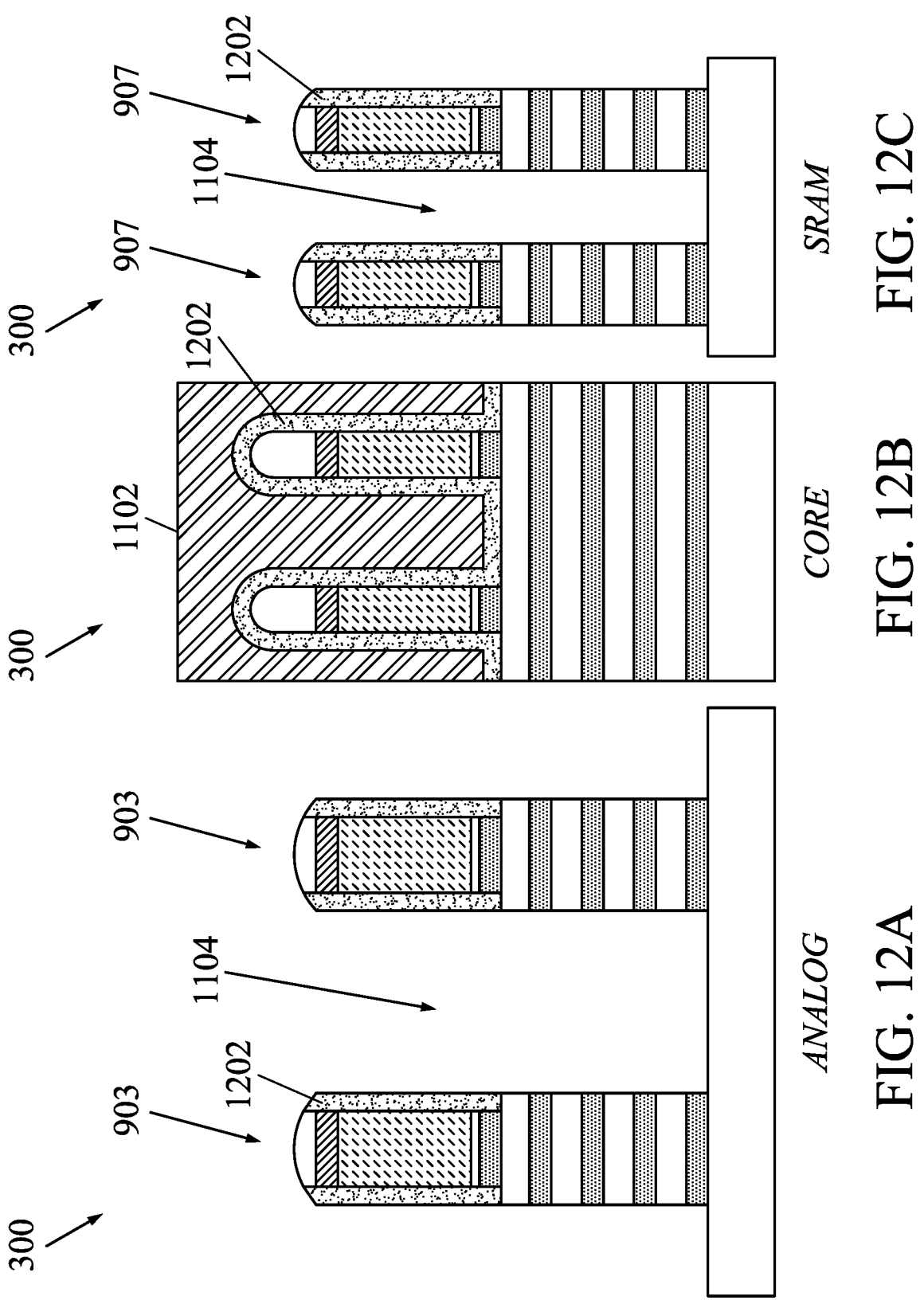

In some embodiments, and after formation of the gate stacks 903, 905, 907, a spacer layer 1202 is deposited on the substrate. The spacer layer 1202 may be a conformal layer. The spacer layer 1202 is illustrated in a variety of figures, for example, as shown in FIGS. 12A/12B/12C. The spacer layer 1202 may be deposited over and on sidewalls of the gate stacks 903, 905, 907. In some cases, the spacer layer 1202 may have a thickness of about 2-10 nm. In some examples, the spacer layer 1202 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the spacer layer 1202 includes multiple layers, such as main spacer layers, liner layers, and the like. By way of example, the spacer layer 1202 may be formed by conformally depositing a dielectric material over the device 300 using processes such as a CVD process, a subatmospheric CVD (SACVD) process, a flowable CVD process, an ALD process, a PVD process, or other suitable process.

Figures 11A, 11B, 11C:
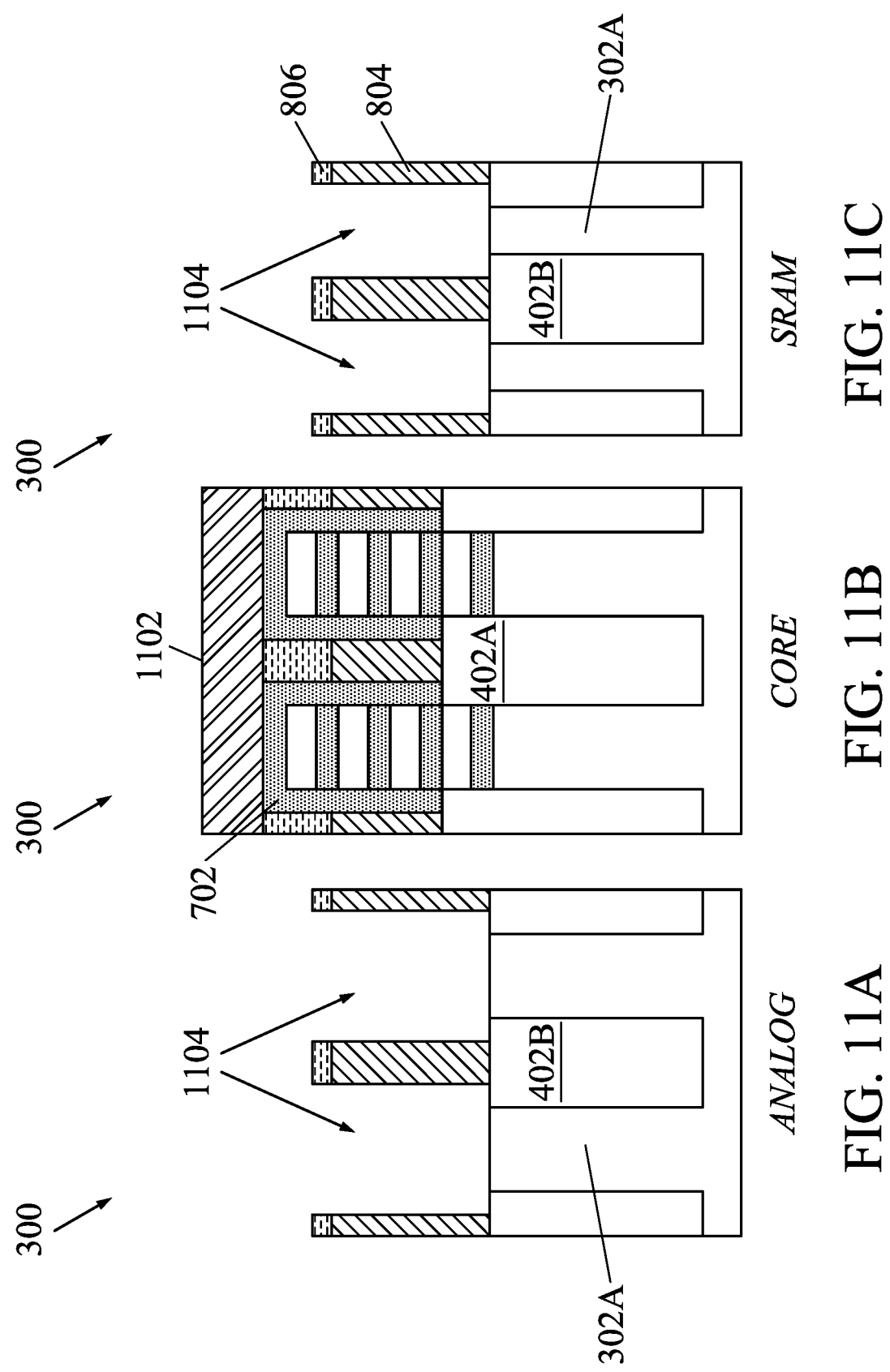
FIGS. 11A/11B/11C, 13A/13B/13C, 15A/15B/15C, 17A/17B/17C, and 19A/19B/19C provide cross-sectional views of an embodiment of the semiconductor device 300 along a plane substantially parallel to a plane defined by section BB' of FIG. 1, in accordance with some embodiments.

The method 200 then proceeds to block 216 where a first source/drain etch process is performed. With reference to FIGS. 11A/11B/11C and 12A/12B/12C, in an embodiment of block 216, a first source/drain etch process is performed to the analog and SRAM device regions of the semiconductor device 300. The FIGS. 11A/11B/11C provide cross-sectional views of an embodiment of the semiconductor device 300 along a plane substantially parallel to a plane defined by section BB' of FIG. 1, and the FIGS. 12A/12B/12C provide cross-sectional views of an embodiment of the semiconductor device 300 along a plane substantially parallel to a plane defined by section AA' of FIG. 1. In some embodiments, a resist layer is formed over the device 300 and patterned to form a patterned resist layer 1102 that exposes the analog and SRAM device regions of the semiconductor device 300, while the patterned resist layer 1102 remains disposed over the core device region. In some embodiments, after formation of the patterned resist layer 1102, the first source/drain etch process is performed to remove the fin cladding layer 702 and the exposed epitaxial layers 308, 310 in source/drain regions of the analog and SRAM device regions to form trenches 1104 which expose underlying substrate portions 302A of the fins 304 in the analog and SRAM device regions, while the core device region remains masked by the patterned resist layer 1102. By way of example, the first source/drain etch process may serve to remove portions of the epitaxial layers 308, 310 (in source/drain regions of the analog and SRAM device regions) that were exposed during the second STI recess process of block 208, described above. As shown in FIGS. 12A and 12C, the first source/drain etch process may also remove portions of the spacer layer 1202 (e.g., from top surfaces of the gate stacks 903 and 907). In some embodiments, the first source/drain etch process may include a dry etching process, a wet etching process, and/or a combination thereof. After the first source/drain etch process, the patterned resist layer 1102 may be removed, for example, by way of a solvent, resist stripper, ashing, or other suitable technique.

Figures 13A, 13B, 13C:
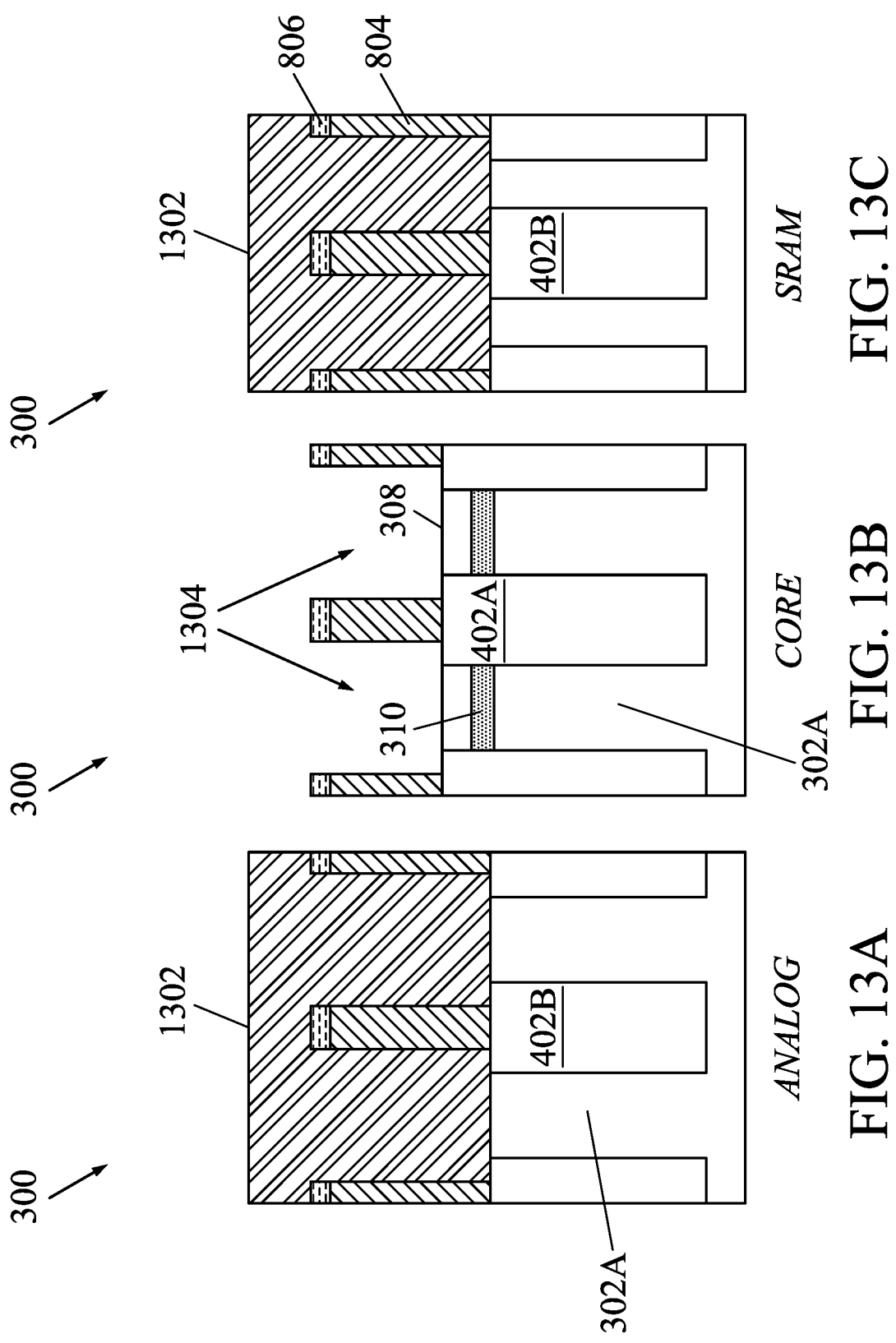
Figures 14A, 14B, 14C:
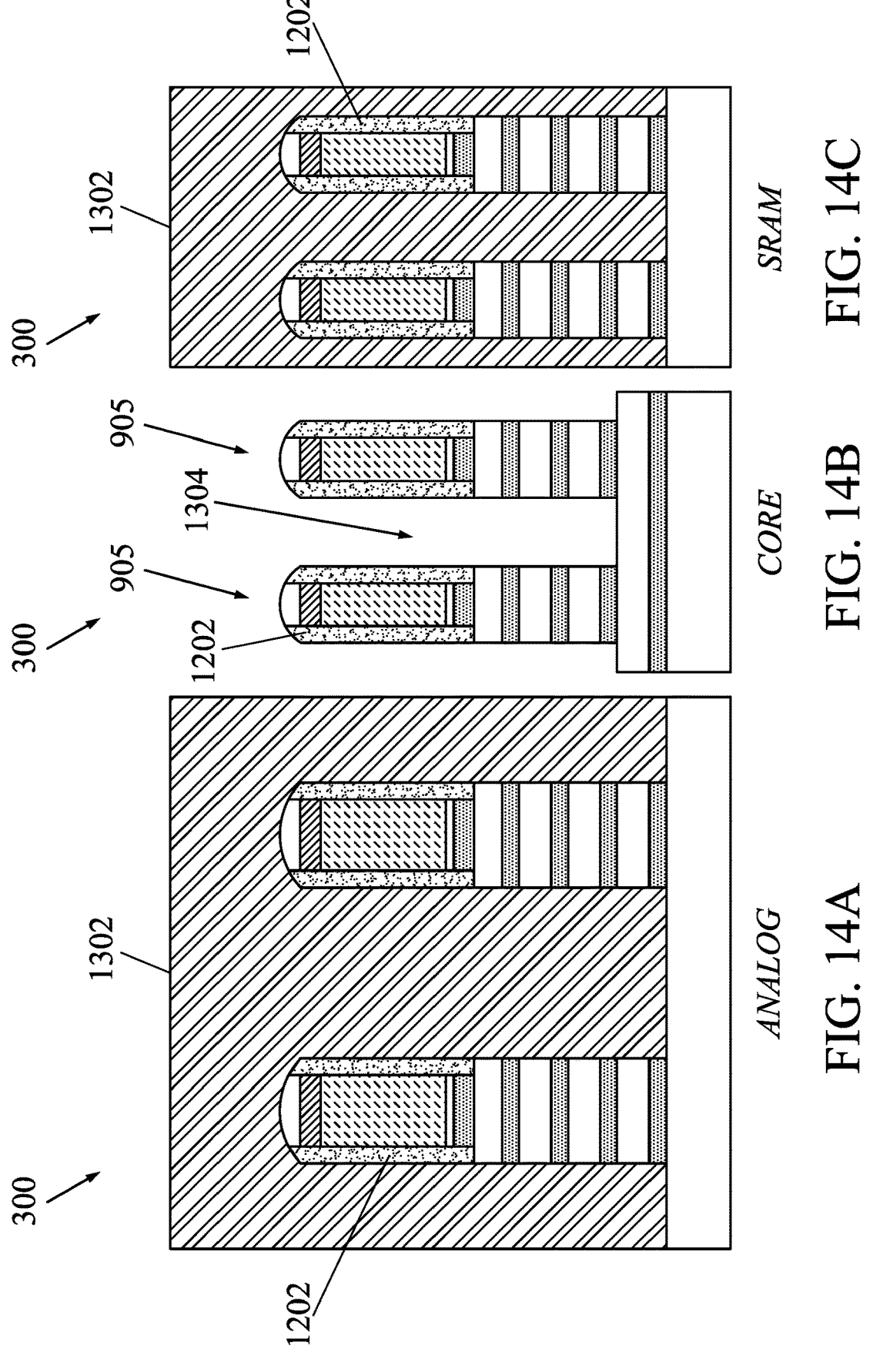

The method 200 then proceeds to block 218 where a second source/drain etch process is performed. With reference to FIGS. 13A/13B/13C and 14A/14B/14C, in an embodiment of block 218, a second source/drain etch process is performed to the core device region of the semiconductor device 300. The FIGS. 13A/13B/13C provide cross-sectional views of an embodiment of the semiconductor device 300 along a plane substantially parallel to a plane defined by section BB' of FIG. 1, and the FIGS. 14A/14B/14C provide cross-sectional views of an embodiment of the semiconductor device 300 along a plane substantially parallel to a plane defined by section AA' of FIG. 1. In some embodiments, a resist layer is formed over the device 300 and patterned to form a patterned resist layer 1302 that exposes the core device region of the semiconductor device 300, while the patterned resist layer 1302 remains disposed over the analog and SRAM device regions. In some embodiments, after formation of the patterned resist layer 1302, the second source/drain etch process is performed to remove the fin cladding layer 702 and the exposed epitaxial layers 308, 310 in source/drain regions of the core device region to form trenches 1304 which expose underlying portions of the fins 304 in the core device region, while the analog and SRAM device regions remain masked by the patterned resist layer 1302. By way of example, the second source/drain etch process may serve to remove portions of the epitaxial layers 308, 310 (in source/drain regions of the core device region) that were exposed during the first STI recess process of block 206 (e.g., including the subset 502 of the epitaxial stack of layer 308, 310), described above. Epitaxial layers 308, 310 (including at least one semiconductor channel layer) not exposed by the first STI recess process may remain embedded within the STI features 402A beneath the trenches 1304, as shown in FIG. 13B. With reference to FIG. 14B, the second source/drain etch process may also remove portions of the spacer layer 1202 (e.g., from top surfaces of the gate stack 905). In some embodiments, the second source/drain etch process may include a dry etching process, a wet etching process, and/or a combination thereof. After the second source/drain etch process, the patterned resist layer 1302 may be removed, for example, by way of a solvent, resist stripper, ashing, or other suitable technique.

Figures 15A, 15B, 15C:
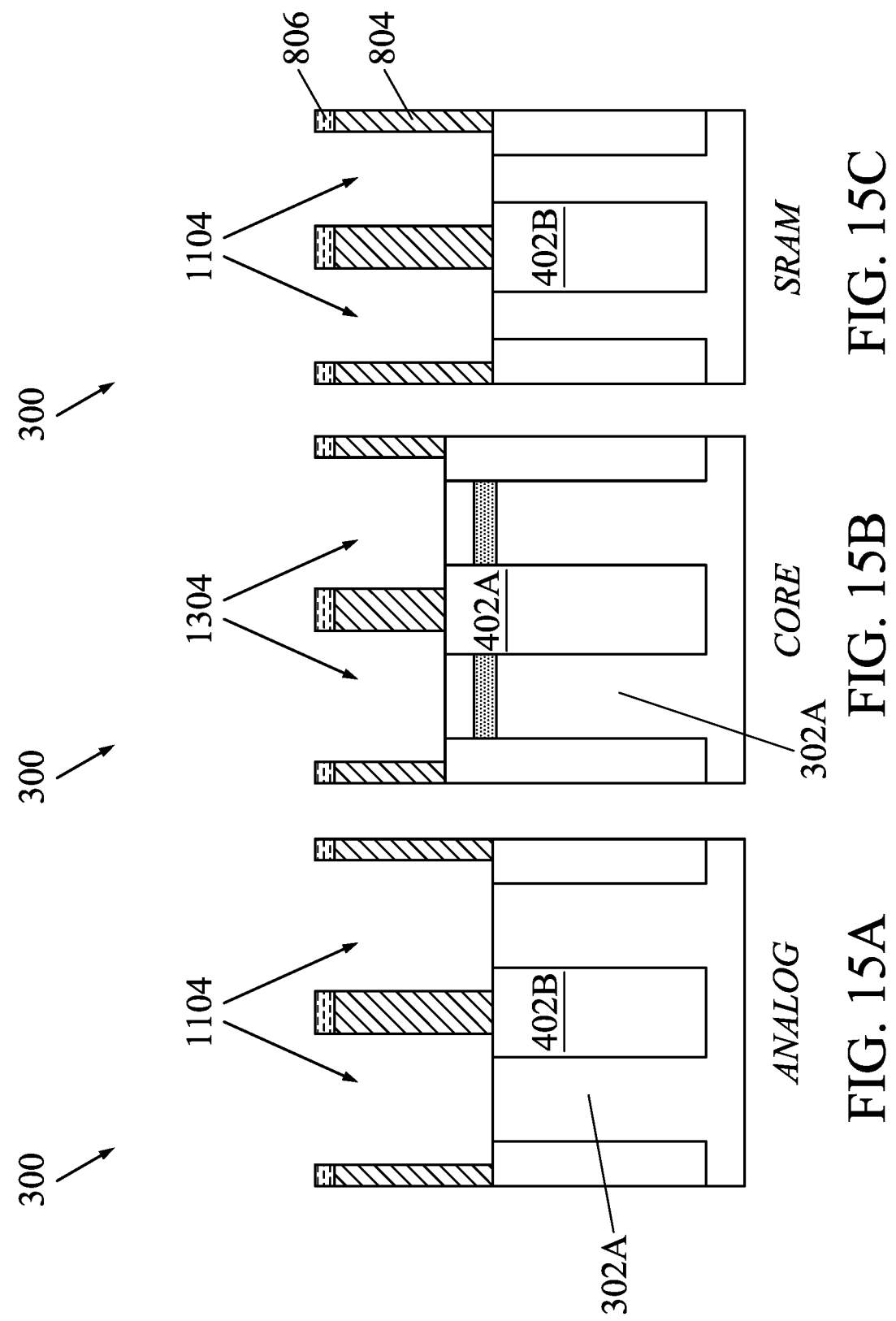
Figures 16A, 16B, 16C:
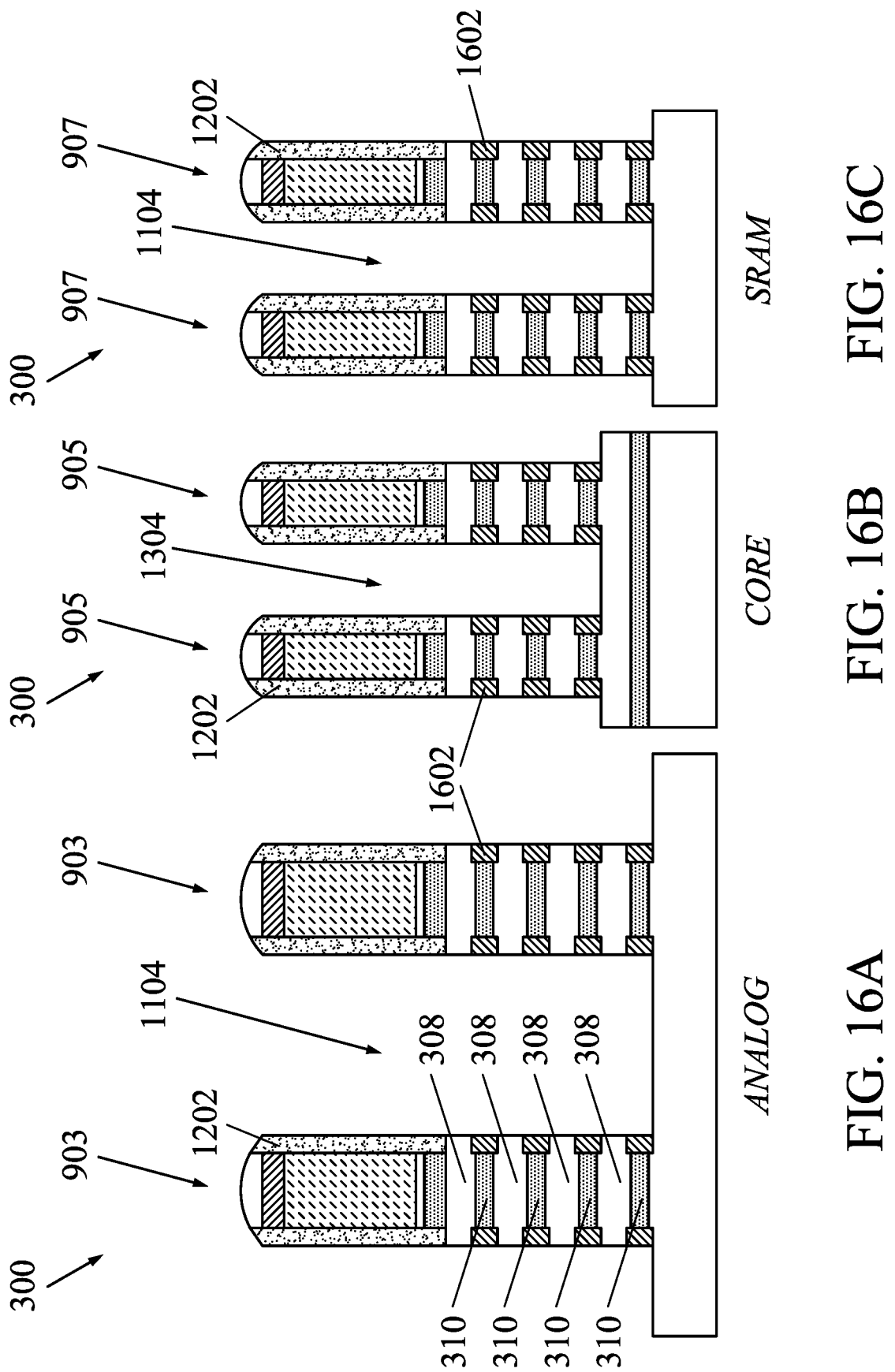

The method 200 then proceeds to block 220 where inner spacers are formed. With reference to FIGS. 15A/15B/15C and 16A/16B/16C, in an embodiment of block 220, inner spacers 1602 are formed in each of the analog, core, and SRAM device regions of the semiconductor device 300. The FIGS. 15A/15B/15C provide cross-sectional views of an embodiment of the semiconductor device 300 along a plane substantially parallel to a plane defined by section BB' of FIG. 1, and the FIGS. 16A/16B/16C provide cross-sectional views of an embodiment of the semiconductor device 300 along a plane substantially parallel to a plane defined by section AA' of FIG. 1. In some embodiments, formation of the inner spacers 1602 may include a lateral etch of the epitaxial layers 310 (SiGe layers), followed by deposition and etch-back of a dielectric material to form the inner spacers 1602. In some embodiments, the inner spacers 1602 include amorphous silicon. In some examples, the inner spacers 1602 may include silicon oxide, silicon nitride, silicon carbide, silicon oxynitride, SiCN, silicon oxycarbide, SiOCN, a low-K material (e.g., with a dielectric constant 'k'<7), and/or combinations thereof. In various examples, the inner spacer layers 1602 may extend beneath the spacer layer 1202 (formed on sidewalls of the gate stacks 903, 905, 907) while abutting subsequently formed source/drain features, described below.

Figures 18A, 18B, 18C:
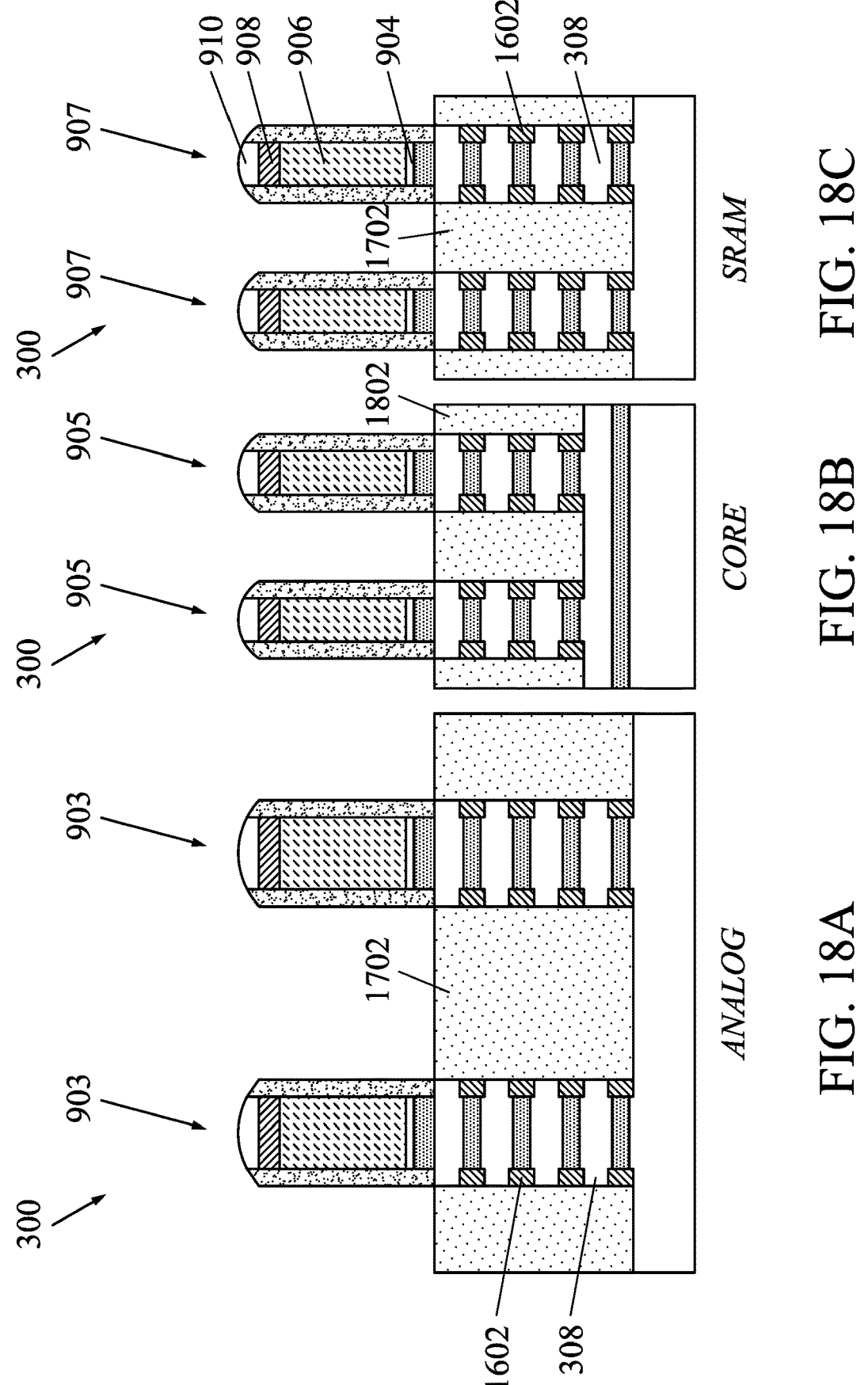

The method 200 then proceeds to block 222 where source/drain features are formed. With reference to FIGS. 17A/17B/17C and 18A/18B/18C, in an embodiment of block 222, source/drain features 1702 are formed in the analog and SRAM device regions of the semiconductor device 300, and source/drain features 1802 are formed in the core device region of the semiconductor device 300. The FIGS. 17A/17B/17C provide cross-sectional views of an embodiment of the semiconductor device 300 along a plane substantially parallel to a plane defined by section BB' of FIG. 1, and the FIGS. 18A/18B/18C provide cross-sectional views of an embodiment of the semiconductor device 300 along a plane substantially parallel to a plane defined by section AA' of FIG. 1. In some embodiments, the source/drain features 1702, 1802 are formed in source/drain regions adjacent to and on either side of the gate stacks 903, 905, 907. For example, the source/drain features 1702 may be formed within the trenches 1104 of the analog and SRAM device regions, over the exposed substrate portions 302A and in contact with the adjacent inner spacers 1602 and the semiconductor channel layers (the epitaxial layers 308). Similarly, the source/drain features 1802 may be formed within the trenches 1304 of the core device region, over the epitaxial layers 308, 310 embedded with the STI features 402 and in contact with the adjacent inner spacers 1602 and the semiconductor channel layers (the epitaxial layers 308).

In some embodiments, the source/drain features 1702, 1802 are formed by epitaxially growing a semiconductor material layer in the source/drain regions. In various embodiments, the semiconductor material layer grown to form the source/drain features 1702, 1802 may include Ge, Si, GaAs, AlGaAs, SiGe, GaAsP, SiP, or other suitable material. The source/drain features 1702, 1802 may be formed by one or more epitaxial (epi) processes. In some embodiments, the source/drain features 1702, 1802 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 1702, 1802 are not in-situ doped, and instead an implantation process is performed to dope the source/drain features 1702, 1802. In some embodiments, formation of the source/drain features 1702, 1802 may be performed in separate processing sequences for each of N-type and P-type source/drain features. As illustrated in FIGS. 17A/17B/17C, the bi-layer dielectric 802 may effectively prevent the undesirable lateral merging of the source/drain features 1702, 1802 formed on adjacent fins 304.

Figures 19A, 19B, 19C:
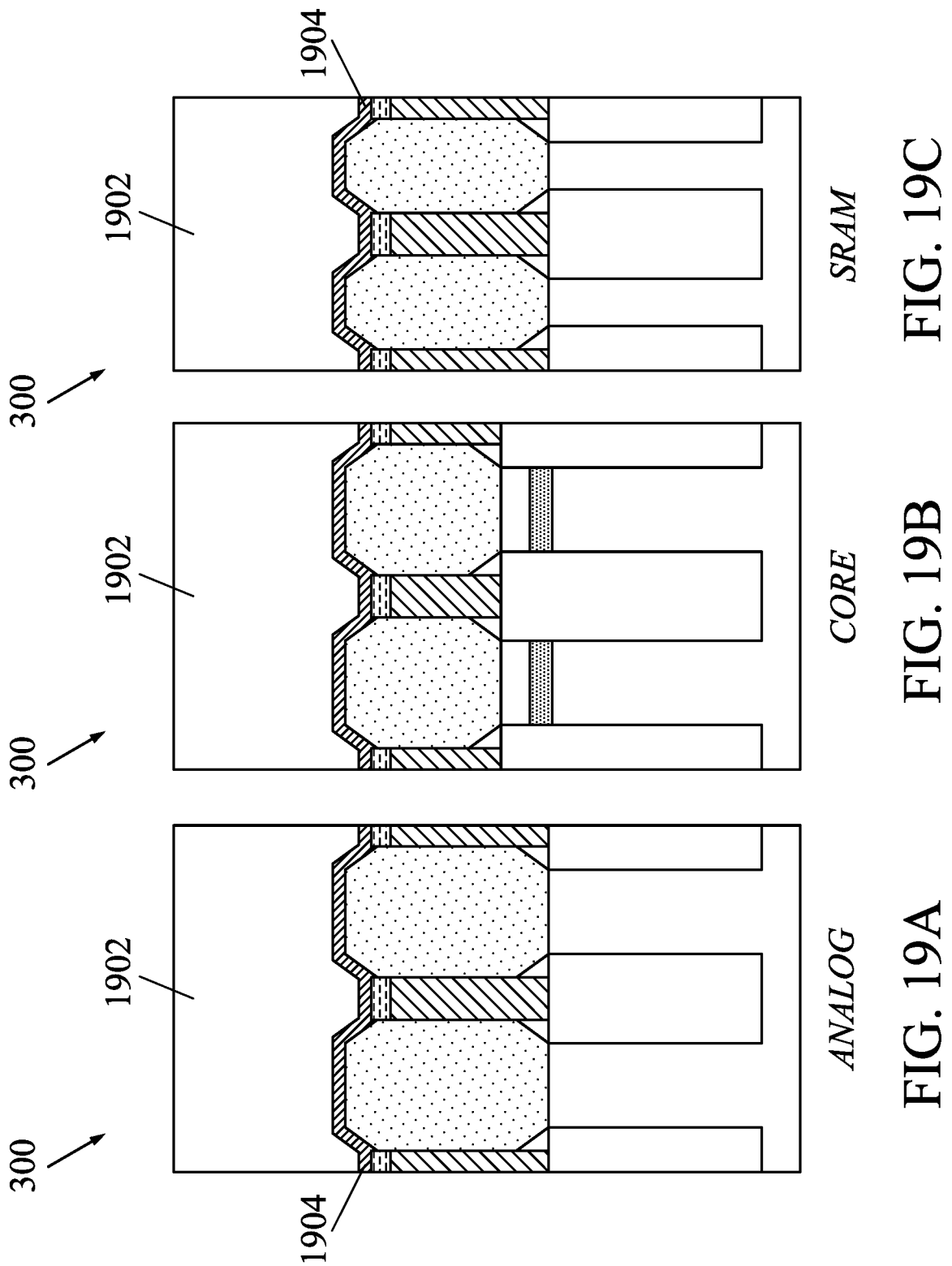
Figures 20A, 20B, 20C:
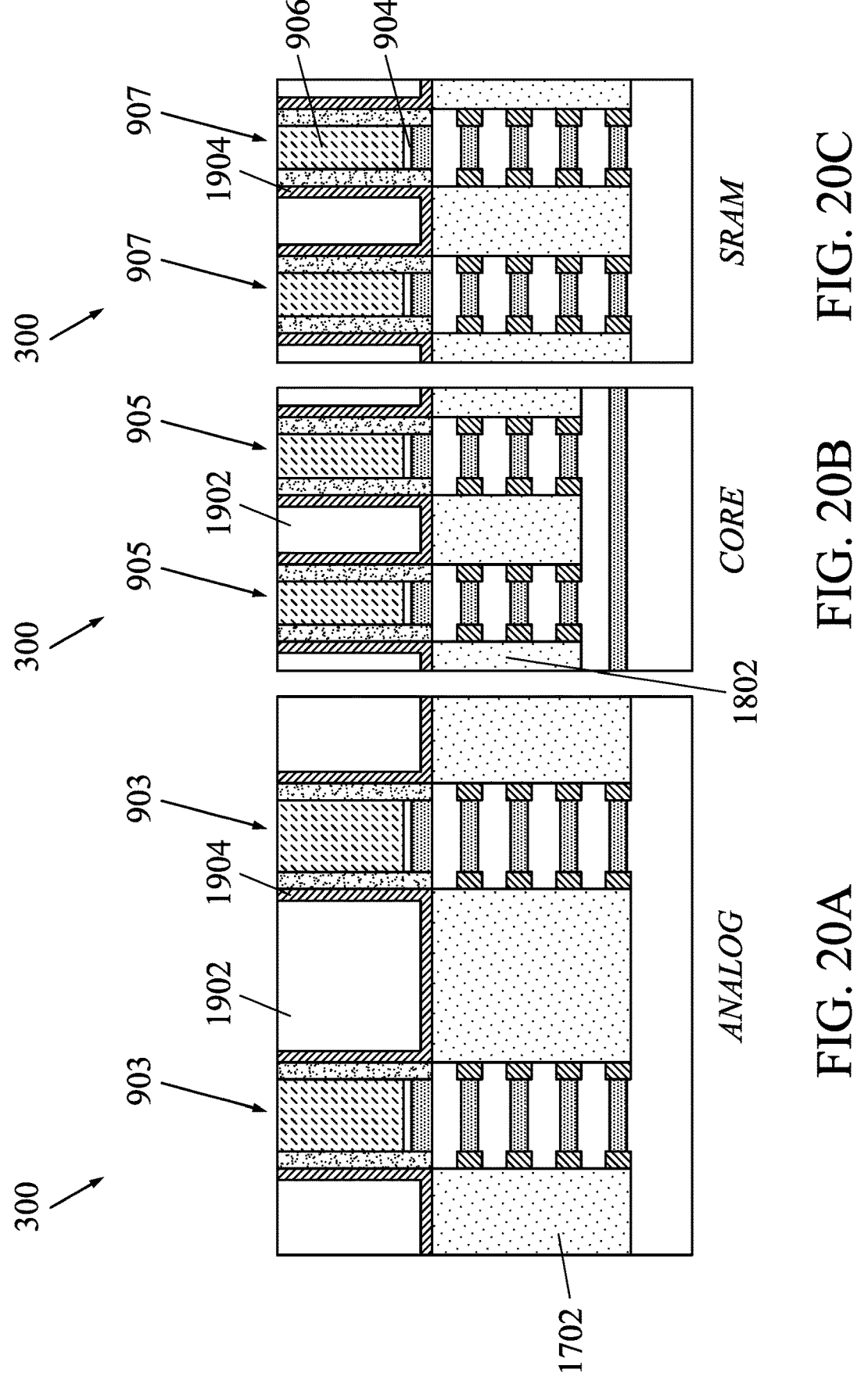

The method 200 then proceeds to block 224 where an inter-layer dielectric (ILD) layer is formed. With reference to FIGS. 19A/19B/19C and 20A/20B/20C, in an embodiment of block 224, an ILD layer 1902 is formed in each of the analog, core, and SRAM device regions of the semiconductor device 300. The FIGS. 19A/19B/19C provide cross-sectional views of an embodiment of the semiconductor device 300 along a plane substantially parallel to a plane defined by section BB' of FIG. 1, and the FIGS. 20A/20B/20C provide cross-sectional views of an embodiment of the semiconductor device 300 along a plane substantially parallel to a plane defined by section AA' of FIG. 1. In some embodiments, a contact etch stop layer (CESL) 1904 is formed over the device 300 prior to forming the ILD layer 1902. In some examples, the CESL 1904 includes a silicon nitride layer, silicon oxide layer, a silicon oxynitride layer, and/or other materials known in the art. The CESL 1904 may be formed by plasma-enhanced chemical vapor deposition (PECVD) process and/or other suitable deposition or oxidation processes. In some embodiments, the ILD layer 1902 includes materials such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. The ILD layer 1902 may be deposited by a PECVD process or other suitable deposition technique. In some embodiments, after formation of the ILD layer 1902, the device 300 may be subject to a high thermal budget process to anneal the ILD layer 1902.

In some examples, after depositing the ILD layer 1902 (and/or the CESL 1904 or other dielectric layers), a planarization process may be performed to expose a top surface of the gate stacks 903, 905, 907. For example, a planarization process includes a CMP process which removes portions of the ILD layer 1902 (and CESL 1904, if present) overlying the gate stacks 903, 905, 907 and planarizes a top surface of the device 300. In addition, the CMP process may remove the hard mask layers 908, 910 overlying the gate stacks 903, 905, 907 to expose the underlying electrode layer 906, such as a polysilicon electrode layer, of the dummy gates.

Figures 21A, 21B, 21C:
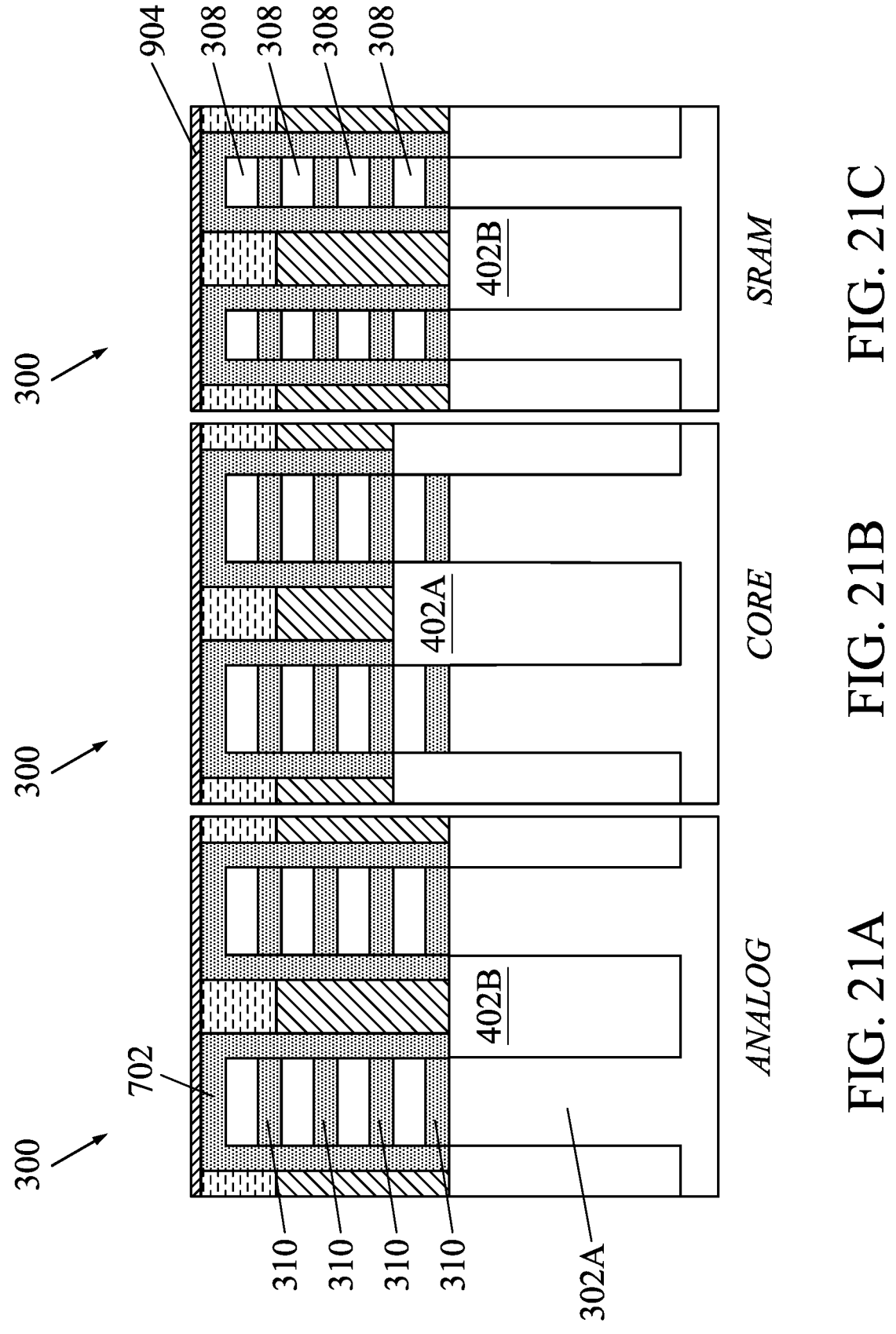

The method 200 proceeds to block 226 where the dummy gate is removed. Referring to the example of FIGS. 20A/20B/20C and 21A/21B/21C, in an embodiment of block 226, the exposed electrode layer 906 of the gate stacks 903, 905, 907 may be removed by a suitable etching process. The FIGS. 21A/21B/21C provide cross-sectional views of an embodiment of the semiconductor device 300 along a plane substantially parallel to a plane defined by section CC' of FIG. 1. In various embodiments, the electrode layer 906 may be etched using a wet etch, a dry etch, or a combination thereof. In some embodiments, and as a result of removing the electrode layer 906, the underlying dielectric layer 904 is exposed.

Figures 22A, 22B, 22C:
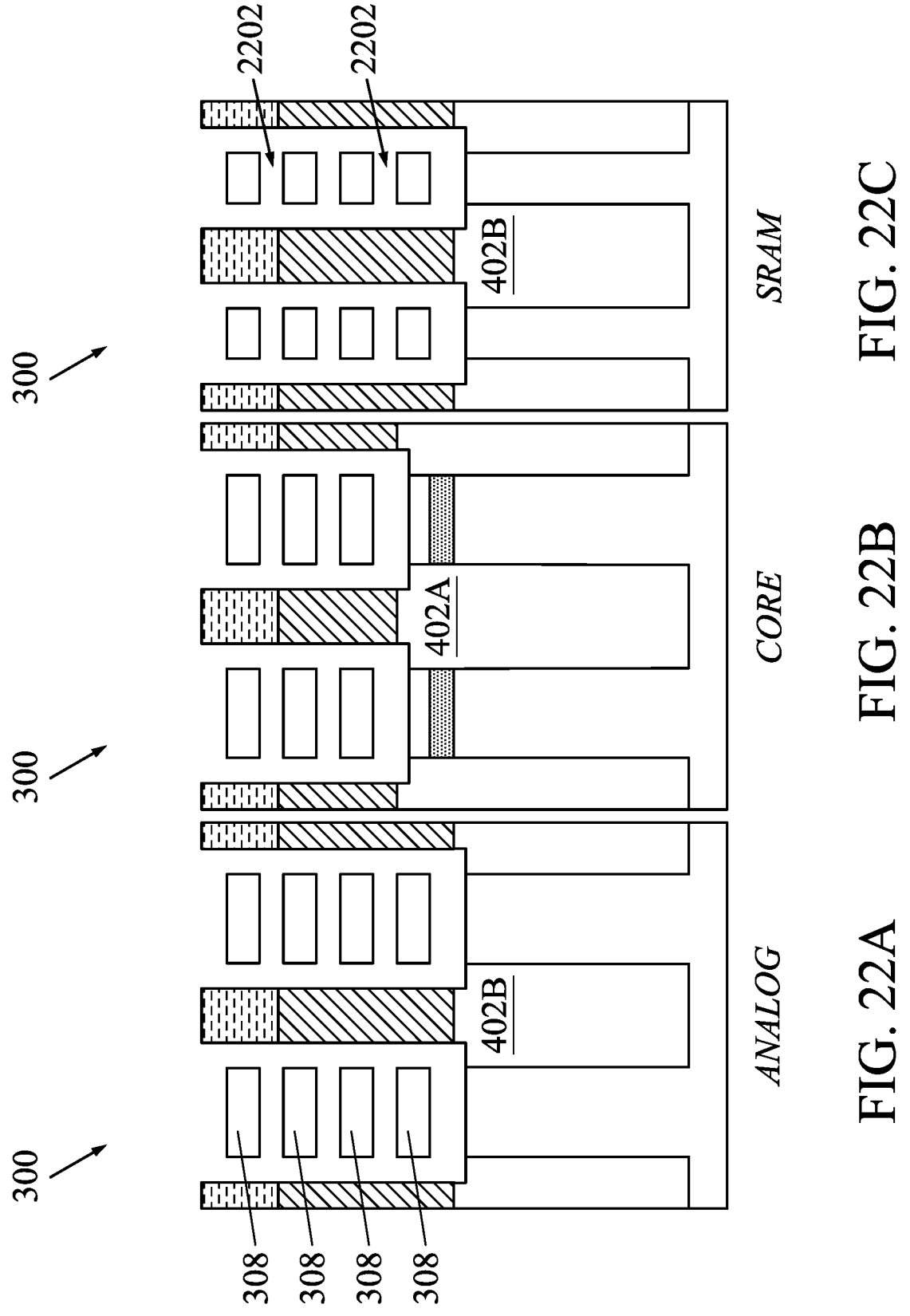

The method 200 proceeds to block 228 where the gate stack dielectric layer and underlying SiGe layers are removed. Referring to the example of FIGS. 21A/21B/21C and 22A/22B/22C, in an embodiment of block 228, the exposed dielectric layer 904 of the gate stacks 903, 905, 907 may initially be removed by a suitable etching process such as a wet etch, a dry etch, or a combination thereof. The FIGS. 22A/22B/22C provide cross-sectional views of an embodiment of the semiconductor device 300 along a plane substantially parallel to a plane defined by section CC' of FIG. 1. After removal of the dielectric layer 904, and in a further embodiment of block 228, a selective removal of the SiGe layers (including the fin cladding layer 702 and the epitaxial layers 310) in the channel region of the GAA transistor in each of the analog, core, and SRAM device regions of the semiconductor device 300 is performed. In some embodiments, the SiGe layers are removed from the fins 304 within a trench provided by the removal of the dummy gate electrode layer 906 and the dielectric layer 904. In various examples, the SiGe layers (including the fin cladding layer 702 and the epitaxial layers 310) are removed from the exposed fins 304 using a selective wet etching process. In some embodiments, the selective wet etching includes ammonia and/or ozone. As merely one example, the selective wet etching includes tetra-methyl ammonium hydroxide. (TMAH). In an embodiment, the fin cladding layer 702 and the epitaxial layers 310 are SiGe and the epitaxial layers 308 are silicon, allowing for the selective removal of the SiGe layers. It is noted after selective removal of the SiGe layers, gaps may be formed between the adjacent semiconductor channel layers in the channel region (e.g., gaps 2202 between epitaxial layers 308). In some examples, selective removal of the SiGe layers, as described above, may be referred to as a semiconductor channel layer release process.

Figures 23A, 23B, 23C:
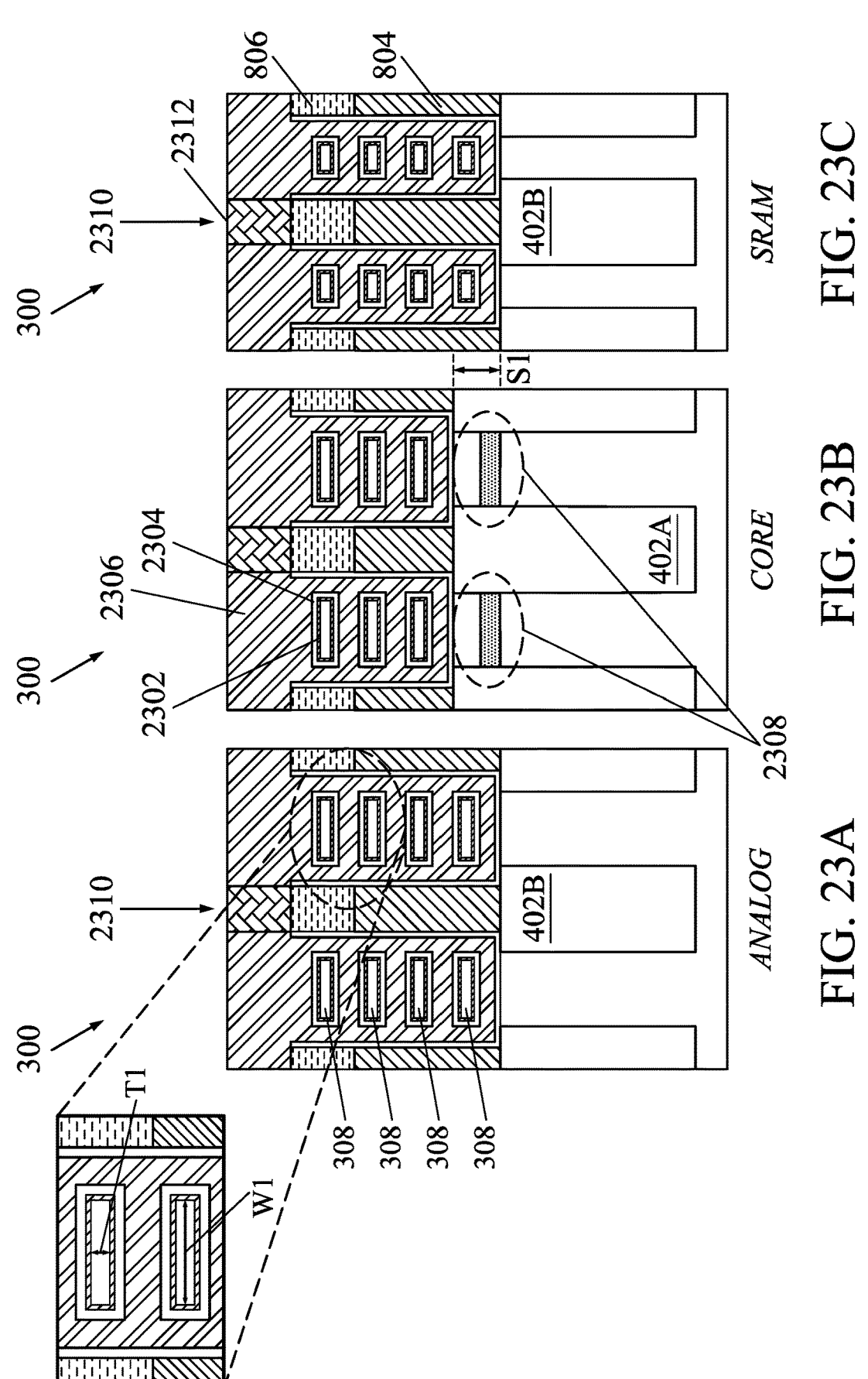

The method 200 then proceeds to block 230 where a gate structure is formed. With reference to FIGS. 23A/23B/23C and 24A/24B/24C, in an embodiment of block 230, a gate structure is formed in each of the analog, core, and SRAM device regions of the semiconductor device 300. The FIGS.

Figures 24A, 24B, 24C:
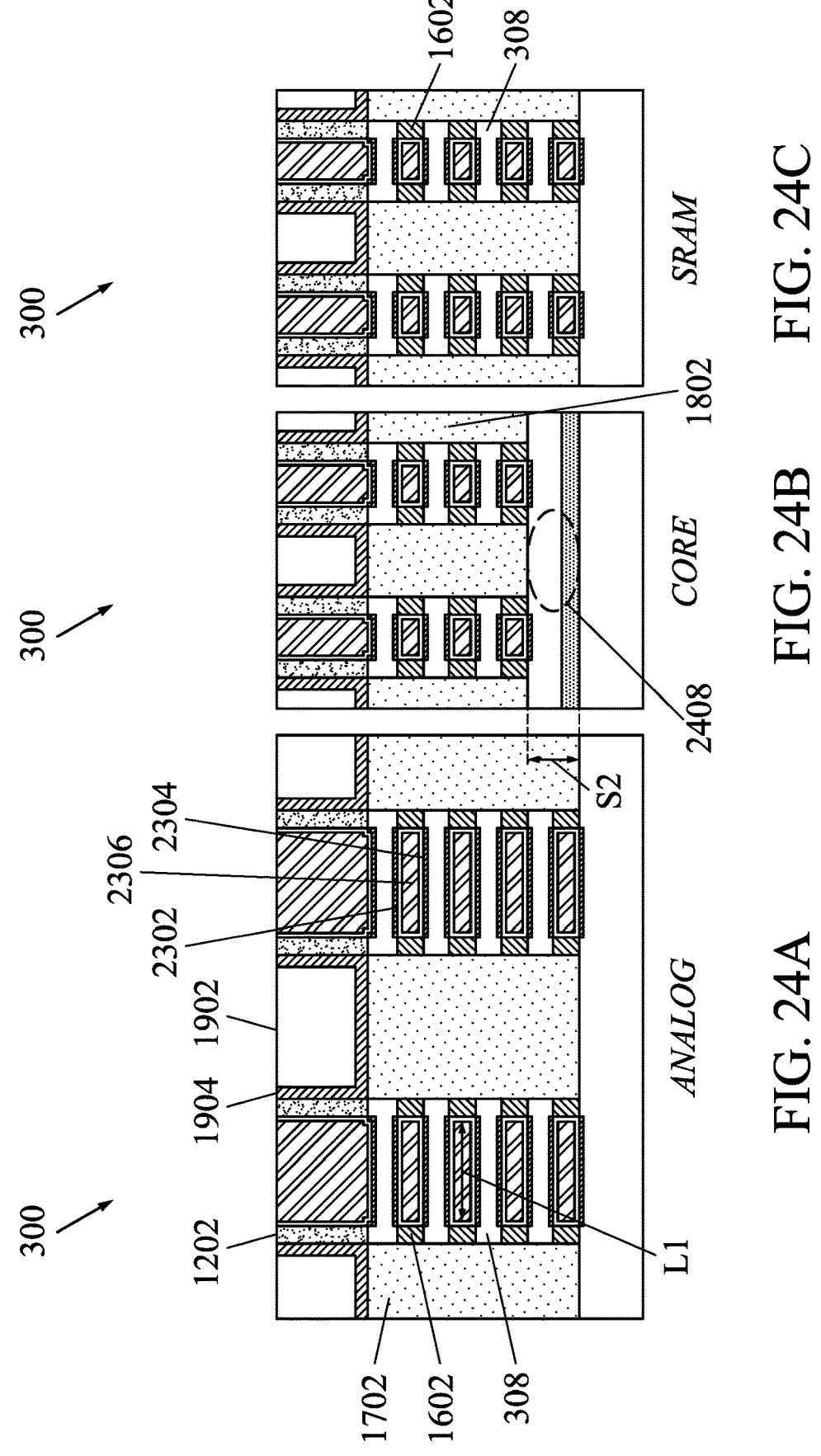

23A/23B/23C provide cross-sectional views of an embodiment of the semiconductor device 300 along a plane substantially parallel to a plane defined by section CC' of FIG. 1, and the FIGS. 24A/24B/24C provide cross-sectional views of an embodiment of the semiconductor device 300 along a plane substantially parallel to a plane defined by section AA' of FIG. 1. The gate structures described herein may include a high-K/metal gate stack, however other compositions are possible. In some embodiments, the gate structures may form the gate associated with the multi-channels provided by the plurality of exposed semiconductor channel layers (the exposed epitaxial layers 308, now having gaps there between) in the channel regions of GAA transistors in each of the analog, core, and SRAM device regions of the device 300. In some embodiments, a gate dielectric is formed within the trench of the GAA transistors in each of the analog, core, and SRAM device regions of the device 300 provided by the removal of the dummy gate and/or by the release of the semiconductor channel layers, as described above. In various embodiments, the gate dielectric includes an interfacial layer (IL) 2302 and a high-K gate dielectric layer 2304 formed over the interfacial layer 2302. In some embodiments, the gate dielectric has a total thickness of about 1-5 nm. High-K gate dielectrics, as used and described herein, include dielectric materials having a high dielectric constant, for example, greater than that of thermal silicon oxide (~3.9).

In some embodiments, the interfacial layer 2302 may include a dielectric material such as silicon oxide ($SiO_2$), HfSiO, or silicon oxynitride (SiON). The interfacial layer 2302 may be formed by chemical oxidation, thermal oxidation, atomic layer deposition (ALD), chemical vapor deposition (CVD), and/or other suitable method. The high-K gate dielectric layer 2304 may include a high-K dielectric layer such as hafnium oxide ($HfO_2$). Alternatively, the high-K gate dielectric layer 2304 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr) $TiO_3$ (BST), $Al_2O_3$, $Si_3N_4$, oxynitrides (SiON), combinations thereof, or other suitable material. The high-K gate dielectric layer 2304 may be formed by ALD, physical vapor deposition (PVD), CVD, oxidation, and/or other suitable methods.

In a further embodiment of block 230, a metal gate including a metal layer 2306 is formed over the gate dielectric (e.g. over the IL 2302 and the high-K gate dielectric layer 2304). The metal layer 2306 may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the device 300.

In some embodiments, the metal layer 2306 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 2306 may include Ti, Ag. Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 2306 may be formed by ALD, PVD. CVD, e-beam evaporation, or other suitable process. Further, the metal layer 2306 may be formed separately for N-type and P-type transistors which may use different metal layers. In addition, the metal layer 2306 may provide an N-type or P-type work function, may serve as a transistor (e.g., GAA transistor) gate electrode, and in at least some embodiments, the metal layer 2306 may include a polysilicon layer. With respect to the GAA transistors shown and discussed, the gate structure includes portions that interpose each of the epitaxial layers 308, which each provide semiconductor channel layers for the GAA transistors.

In various embodiments, the channel regions formed by the epitaxial layers 308, and which define the semiconductor channel layers, may have a variety of dimensions within each of the analog, core, and SRAM device regions of the semiconductor device 300. Consider, for example, a general thickness dimension 'Tl' and a general width dimension 'W1' of the epitaxial layers 308 from an end-view of the epitaxial layers 308 (e.g., FIGS. 23A/23B/23C). In some embodiments, the epitaxial layers 308 may have a thickness dimension 'Tl' in a range of about 4-8 nm in each of the analog, core, and SRAM device regions of the semiconductor device 300. In some examples, the epitaxial layers 308 may have a width dimension 'W1' greater than or equal to about 15 nm in the analog device region (FIG. 23A), in a range of about 10-60 nm in the core device region (FIG. 23B), and in a range of about 6-20 nm in the SRAM device region (FIG. 23C) of the semiconductor device 300. In addition, considering a general length dimension 'L1' of the epitaxial layers 308 (e.g., with reference to FIGS. 24A/24B/24C), the epitaxial layers 308 may have a length dimension 'L1' greater than about 20 nm in the analog device region (FIG. 24A), less than or equal to about 20 nm in the core device region (FIG. 24B), and less than or equal to about 20 nm in the SRAM device region (FIG. 24C) of the semiconductor device 300. In some cases, a spacing/gap between adjacent semiconductor channel layers (epitaxial layers 308) is equal to about 4-8 nm (e.g., as determined by a thickness of the released epitaxial layers 310).

In addition, due to the two-step STI recess process (blocks 206 and 208 of the method 200), and the resulting epitaxial layers 308, 310 that remain embedded within the STI features 402A (e.g., within the core device region), there will be an STI offset 'S1' between the STI features 402A in the core device region and the STI features 402B in the analog/SRAM device regions. In some embodiments, the STI offset 'S1' is greater than or equal to the thickness of a single pair of epitaxial layers 308, 310. Generally, the STI offset 'S1' may be equal to a thickness of a total number of epitaxial layers 308, 310 that remain embedded (or unreleased) within the STI features 402A of the core device region. In some cases, the STI offset 'S1' is in a range of about 8-16 nm. In some examples, the number of embedded (unreleased) epitaxial layers 308, 310 (e.g., indicated by line 2308) in the core device region may be greater than or equal to one (1) pair of epitaxial layers 308, 310. In various embodiments, there may be no embedded (unreleased) epitaxial layers 308, 310 in either of the analog or SRAM device regions of the semiconductor device 300.

Similarly, and again due to the two-step STI recess process, there will be a source/drain offset 'S2' between source/drain features 1802 in the core device region and source/drain features 1702 in the analog/SRAM device regions. In some embodiments, the source/drain offset 'S2' is greater than or equal to the thickness of a single pair of epitaxial layers 308, 310. Generally, the source/drain offset 'S2' may be equal to a thickness of a total number of epitaxial layers 308, 310 that remain embedded or unetched (e.g., during the second source/drain etch process of block 218) within the STI features 402A of the core device region. In some cases, the source/drain offset 'S2' is in a range of about 8-16 nm. In some examples, the number of unetched epitaxial layers 308, 310 (e.g., indicated by line 2408) in source/drain regions of the core device region, and under the source/drain features 1802, may be greater than or equal to one (1) pair of epitaxial layers 308, 310.

The method 200 then proceeds to block 232 where a cut metal gate process is performed. For example, with reference to FIGS. 23A/23B/23C, in an embodiment of block 232 and after forming the metal layer 2306, a cut metal gate process may be performed to isolate the metal layers 2306 of adjacent structures. As one example, a photolithography and etch process may initially be performed to remove a portion of the metal layer 2306 in a cut metal gate region 2310. In some embodiments, removing the portion of the metal layer 2306 in the cut metal gate region 2310 may form a trench that exposes the underlying second material 806 of the bi-layer dielectric 802. Afterwards, in various examples, a cut metal gate material 2312 may be deposited within the trench to electrically isolate the metal layers 2306 of adjacent structures. In some embodiments, the cut metal gate material 2312 includes a nitride-based material deposited by ALD, CVD, PVD, or other appropriate process. In some cases, after depositing the cut metal gate material 2312, a CMP process may be performed to remove excess material and planarize a top surface of the device 300.

In some embodiments, contact features may also be formed. For instance, in some embodiments, a portion of the metal layer 2306 may be etched-back and a tungsten (W) layer or a fluorine-free W (FFW) layer may be deposited over the etched-back metal layer 2306. In various examples, the W layer or the FFW layer may serve as an etch-stop layer and may also provide reduced contact resistance (e.g., to the metal layer 2306). In some cases, a self-aligned contact layer may be formed over the W layer or the FFW layer, where the self-aligned contact layer may include a dielectric material such as silicon oxide, silicon nitride, silicon carbide, silicon oxynitride, combinations thereof, or another suitable material. In various embodiments, source/drain contacts are formed to provide contact to the source/drain features 1702, 1802, and vias may be formed to provide an electrical connection to the source/drain contacts. In some embodiments, a metal contact etch stop layer (MCESL) and an ILD layer may also be formed.

Generally, the semiconductor device 300 may undergo further processing to form various features and regions known in the art. For example, subsequent processing may form contact openings, contact metal, as well as various contacts/vias/lines and multilayer interconnect features (e.g., metal layers and interlayer dielectrics) on the substrate 302, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200. Further, while the method 200 has been shown and described as including the device 300 having a GAA transistor, it will be understood that other device configurations are possible. In some embodiments, the method 200 may be used to fabricate FinFET devices or other multi-gate devices.

With respect to the description provided herein, disclosed are methods and structures for providing multi-gate devices (e.g., such as a GAA transistors) having a number of semiconductor channel layers selected based on the device type being implemented by the multi-gate device. In some embodiments, core (logic) devices may be implemented using a fewer number of semiconductor channel layers as compared to SRAM and analog devices, while both SRAM and analog devices may be implemented using a greater number of semiconductor channel layers as compared to core (logic) devices. In some examples, core (logic) devices may be implemented using a fewer number of semiconductor channel layers in order to reduce total device capacitance and provide increased device speed. Alternatively, in various embodiments, SRAM devices may be implemented using a greater number of semiconductor channel layers in order to provide increased cell current. In some embodiments, analog devices may be implemented using a greater number of semiconductor channel layers in order to provide increased cell capacitance. In some examples, the number of semiconductor channel layers for a core (logic) device may be less than or equal to three (3), and the number of semiconductor channel layers for both SRAM and analog devices may be greater than or equal to four (4). Generally, by providing multi-gate devices having a number of semiconductor channel layers selected based on the device type being implemented (e.g., core, SRAM, or analog device), embodiments of the present disclosure provide methods and device structures that are able to meet the diverse performance requirements of a variety of different device types simultaneously. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method that includes providing a first fin in a first device type region and a second fin in a second device type region. In some embodiments, each of the first and second fins include a plurality of semiconductor channel layers. In some examples, the method further includes performing a two-step recess of an STI region on opposing sides of each of the first and second fins to expose a first number of semiconductor channel layers of the plurality of semiconductor channel layers of the first fin in the first device type region and a second number of semiconductor channel layers of the plurality of semiconductor channel layers of the second fin in the second device type region. In various embodiments, the method further includes forming a first gate structure in the first device type region and a second gate structure in the second device type region, where the first gate structure is formed over the first fin having the first number of exposed semiconductor channel layers, and where the second gate structure is formed over the second fin having the second number of exposed semiconductor channel layers.

In another of the embodiments, discussed is a method that includes providing a plurality of fins extending from a substrate, where each of the plurality of fins includes a stack of epitaxial layers having a plurality of a first type of layers and a plurality of a second type of layers. In some embodiments, the method further includes forming a plurality of STI features interposing the plurality of fins. Thereafter, in some cases, a first STI recess process is performed to expose a first number of each of the first and second type of layers within each of the plurality of fins. In some embodiments, a second number of each of the first and second type of layers remains embedded within the STI features after the first STI recess process. In some examples, the method further includes performing a second STI recess process to expose the second number of each of the first and second type of layers in a first region of the semiconductor device, where the second number of each of the first and second type of layers remains embedded within the STI features in a second region of the semiconductor device after the second STI recess process.

In yet another of the embodiments, discussed is a semiconductor device including a first transistor in a first device type region of a substrate and a second transistor in a second device type region of the substrate. In some embodiments, the first transistor includes a first gate structure and a first source/drain feature adjacent to the first gate structure and the second transistor includes a second gate structure and a second source/drain feature adjacent to the second gate structure. In various examples, the first transistor includes a first fin having a first number of semiconductor channel layers disposed over a first STI region and in lateral contact with the first source/drain feature, the second transistor includes a second fin having a second number of semiconductor channel layers disposed over a second STI region and in lateral contact with the second source/drain feature, and the first number of semiconductor channel layers is different than the second number of semiconductor channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

performing a two-step recess of a shallow trench isolation (STI) region on opposing sides of each of first and second fins, in respective first and second regions, to expose a first number of semiconductor channel layers of the first fin in the first region and a second number of semiconductor channel layers of the second fin in the second region, wherein the second number of exposed semiconductor channel layers is different than the first number of exposed semiconductor channel layers;

after performing the two-step recess of the STI region, forming a multi-layer dielectric over the STI region adjacent to each of the first and second fins; and after forming the multi-layer dielectric, forming a first gate structure in the first region and a second gate structure in the second region.

2. The method of claim 1, wherein a first step of the two-step recess exposes the first number of semiconductor channel layers of both the first fin in the first region and the second fin in the second region, and wherein a second step of the two-step recess exposes at least one additional semiconductor channel layer of the second fin in the second region to provide the second number of exposed semiconductor channel layers.

3. The method of claim 1, wherein at least one semiconductor channel layer of the first fin remains embedded within the STI region of the first region after the two-step recess.

4. The method of claim 1, wherein the second number of exposed semiconductor channel layers is greater than the first number of exposed semiconductor channel layers.

5. The method of claim 1, wherein the first region includes a core device region, and wherein the second region includes an analog device region or a static random-access memory (SRAM) device region.

6. The method of claim 1, wherein the first gate structure corresponds to a first transistor, wherein the second gate structure corresponds to a second transistor, and wherein the first and second transistors both include gate-all-around (GAA) transistors.

7. The method of claim 1, wherein the forming the multi-layer dielectric over the STI region includes forming the multi-layer dielectric on opposing sides of each of the first and second fins.

8. The method of claim 1, wherein the multi-layer dielectric includes a low-K dielectric layer disposed over the STI region and a high-K dielectric layer disposed over the low-K dielectric layer.

9. The method of claim 1, further comprising:

after performing the two-step recess of the STI region and prior to forming the first and second gate structures, etching source/drain regions of the second region to remove first portions of the second number of exposed semiconductor channel layers to form a first trench in the source/drain regions of the second region; and after etching the source/drain regions of the second region, etching source/drain regions of the first region to remove first portions of the first number of exposed semiconductor channel layers to form a second trench in the source/drain regions of the first region.

10. The method of claim 9, further comprising:

after forming the first trench and the second trench, epitaxially growing source/drain features within each of the first and second trenches, wherein the source/drain features grown in the first trench contact second portions of the second number of exposed semiconductor channel layers disposed beneath the second gate structure, and wherein the source/drain features grown in the second trench contact second portions of the first number of exposed semiconductor channel layers disposed beneath the first gate structure.

11. A method, comprising:

forming a plurality of shallow trench isolation (STI) features interposing a plurality of fins each having a stack of epitaxial layers;

performing a first STI recess process to expose a first number of layers of the stack of epitaxial layers within each of the plurality of fins;

performing a second STI recess process to expose a second number of layers of the stack of epitaxial layers in a first substrate region, wherein the second number layers of the stack of epitaxial layers remains embedded within the STI features in a second substrate region after the second STI recess process; and after performing the second STI recess process, forming a high-K dielectric/low-K dielectric stack over the STI features and adjacent to the exposed layers in each of the first and second substrate regions.

12. The method of claim 11, wherein the first substrate region includes an analog device region or a static random-access memory (SRAM) device region, and wherein the second substrate region includes a core device region.

13. The method of claim 11, further comprising:

after performing the second STI recess process, selectively removing a portion of at least some layers of the stack of epitaxial layers exposed by the first and second STI recess processes within each of the first substrate region and the second substrate region to form gaps between adjacent layers of the stack of epitaxial layers.

14. The method of claim 13, further comprising:

after selectively removing the portion of the at least some layers of the stack of epitaxial layers, forming a portion of a gate structure within each of the gaps.

15. The method of claim 11, wherein the exposed first and second numbers of layers include channel layers associated with a transistor in each of the first and second substrate regions, and wherein a first number of channel layers in the first substrate region is greater than a second number of channel layers in the second substrate region.

16. The method of claim 15, wherein the transistor in each of the first and second substrate regions includes a gate-all-around (GAA) transistor.

17. A method, comprising:

performing a multi-step recess of a shallow trench isolation (STI) region in a first substrate region and a second substrate region to expose a first number of channel layers that extend above the STI region in the first substrate region and a second number of channel layers that extend above the STI region in the second substrate region, wherein the first number of channel layers is different than the second number of channel layers; and after performing the multi-step recess, forming a bi-layer dielectric adjacent to the first number of channel layers in the first substrate region and adjacent to the second number of channel layers in the second substrate region;

wherein a first top surface of the STI region in the first substrate region and a second top surface of the STI region in the second substrate region are offset from one another.

18. The method of claim 17, wherein at least one channel layer in the first substrate region remains embedded within the STI region after performing the multi-step recess.

19. The method of claim 17, wherein the bi-layer dielectric includes a high-K dielectric/low-K dielectric stack.

20. The method of claim 17, further comprising:

after forming the bi-layer dielectric, forming a first gate structure in the first substrate region and a second gate structure in the second substrate region.

* * * * *